(12) United States Patent
Senriuchi et al.

(10) Patent No.: US 8,604,797 B2
(45) Date of Patent: Dec. 10, 2013

(54) METHOD FOR DETERMINING CELL NUMBER, CELL NUMBER DETERMINATION DEVICE, POWER SUPPLY DEVICE AND PROGRAM

(75) Inventors: Tadao Senriuchi, Tokyo (JP); Masahiko Hirokawa, Tokyo (JP); Takumi Sakamoto, Tokyo (JP); Hiroshi Nakazawa, Tokyo (JP); Noriyuki Hirao, Tokyo (JP)

(73) Assignees: TDK-Lambda Corporation, Tokyo (JP); TDK Corporation, Tokyo (JP)

( * ) Notice: Subject to any disclaimer, the term of this patent is extended or adjusted under 35 U.S.C. 154(b) by 424 days.

(21) Appl. No.: 12/659,949

(22) Filed: Mar. 25, 2010

(65) Prior Publication Data
US 2010/0259270 A1 Oct. 14, 2010

(30) Foreign Application Priority Data
Mar. 27, 2009 (JP) .................... 2009-078397

(51) Int. Cl.
*G01N 27/416* (2006.01)
*H02J 7/00* (2006.01)
(52) U.S. Cl.
USPC .......................................... 324/429; 320/116
(58) Field of Classification Search
None
See application file for complete search history.

(56) References Cited

U.S. PATENT DOCUMENTS

| | | | |
|---|---|---|---|
| 5,804,944 A | 9/1998 | Alberkrack et al. | |
| 5,850,136 A * | 12/1998 | Kaneko | 320/119 |
| 5,920,181 A | 7/1999 | Alberkrack et al. | |
| 6,104,164 A * | 8/2000 | Iino et al. | 320/116 |
| 6,274,950 B1 * | 8/2001 | Gottlieb et al. | 307/66 |
| 2005/0110460 A1 * | 5/2005 | Arai et al. | 320/116 |

FOREIGN PATENT DOCUMENTS

| | | |
|---|---|---|
| JP | A-H05-207672 | 8/1993 |
| JP | A-H06-205542 | 7/1994 |
| JP | B-3331529 | 7/2002 |

OTHER PUBLICATIONS

Office Action mailed Aug. 6, 2013 in corresponding JP Application No. 2009-078397.

* cited by examiner

*Primary Examiner* — Melissa Koval
*Assistant Examiner* — Daniel Miller
(74) *Attorney, Agent, or Firm* — Posz Law Group, PLC

(57) ABSTRACT

A number of cells can be determined before control for a battery without providing cell number setting and input means. The cell number determination device comprises voltage measuring units that select an "i"th cell among cells that are connected in series and that configure a battery, and that measure a voltage value between a terminal in which the "i"th cell and an (i−1)th cell, which is in one location higher than the "i"th cell, are connected and a ground potential line, voltage comparators that determine an existence, nonexistence or normality of the cells by comparing a voltage value of an (i+1)th cell that is in one location lower than the "i"th cell with the voltage value of the "i"th cell measured by the voltage measuring units and a cell number determination unit that determines a number of assembled cells and normal cells and cell assembled locations in the battery.

18 Claims, 14 Drawing Sheets

METHOD FOR DETERMINING CELL NUMBER, CELL NUMBER DETERMINATION DEVICE, POWER SUPPLY DEVICE AND PROGRAM

CROSS-REFERENCE TO RELATED APPLICATION

The present application is related to, claims priority from and incorporates by reference Japanese patent application number 2009-078397, filed on Mar. 27, 2009.

BACKGROUND OF THE INVENTION

1. Field of the Invention

The present invention relates to a method for determining a cell number (number of cells), a cell number determination device, a power supply device, and a program.

2. Description of Related Art

A method for configuring a battery in which one battery is configured with one-cell batteries referred to as cells by connecting a plurality of one-cell batteries in series has been widely performed. Since a voltage value of a cell unit is fixed, it is necessary to connect a plurality of cells in series in order to realize a desired voltage value by a user.

As discussed above, a voltage value of the battery that is configured by connecting a plurality of cells in series varies in accordance with the number of cells. Therefore, it is necessary that the number of cells that configure the battery must be known to adjust various types of control for the battery, including charge control, to a voltage value of the battery. For example, JP H6-205542 A (patent reference 1) discloses a battery charge control system in which a setting means for setting the number of cells is provided. The setting means for setting the number of cells in patent reference 1 is, for example, a keyboard.

JP 3331529 B (patent reference 2) discloses an electrical accumulator device and electric power system in which an abnormal battery is detected among a plurality of batteries (corresponding to cells); and the abnormal battery is shorted by electrically removing it through a relay of a switching element. In patent reference 2, although the number of cells is not set, the abnormal cell is removed when it is detected at the time of operation of the battery so that control for adjusting to the remaining number of cells is performed.

As discussed above, it is necessary for a battery configured with a plurality of cells to perform control adjustable for the number of cells. Therefore, when control for a battery is performed, a user and so on is required to set the number of cells in advance. Even though the number of cells is set in advance, an abnormality would occur in a cell while controlling the battery. In this case, it is necessary that the control is performed in accordance with the remaining number of cells from which an abnormal cell is excluded. Therefore, when the control for the battery configured with cells is performed, it is essential that the number of cells is understood before and during the control for the battery.

1. Problems of Cell Number Setting Before Control for Battery

A setting means for the number of cells is required in order to set the number of cells before control for a battery. For example, in patent reference 1, a keyboard corresponds to a cell number setting means. In a control device, it is necessary to have an input means, such as a terminal, for inputting the number of cells set at the cell number setting means. It is not preferable to provide the setting means and the input means because a configuration of the control device is complicated.

For example, eight kinds of settings are required for the control device that corresponds to a first cell through an eighth cell. Therefore, three bits, i.e. three input terminals, are required. These requirements are a big barrier in terms of simplification and miniaturization of a circuit configuration when the control device is realized by an integrated circuit (IC) or the like.

2. Problems of Cell Number Detecting During Control for Battery

When control that is adjusted to the number of cells is performed by detecting the number of cells during the control for a battery, the normal number of cells is not understood at the beginning of the control. Therefore, after the control for the battery is begun, it is necessary to have processing for changing the control contents and so on. During this period, there is a problem that power supplied by the battery is temporarily stopped. In conclusion, even though the number of cells is detected during the control for the battery, it is essential to set the number of cells before the control for the battery.

SUMMARY OF THE INVENTION

The present invention is provided against the background discussed above. An object of the present invention is to provide a method for determining a cell number, a cell number determination device, a power supply device, and a program that can determine the number of cells before control for a battery without providing a cell number setting means and input means.

According to the first aspect of the present invention, there is provided a cell number determination device comprising: a voltage measuring unit that selects an "i"th cell ("i" is an integer from 1 through N) among a number N of cells that are connected in series and that configure a battery, and that measures a voltage value between a terminal in which the "i"th cell and an (i−1)th cell, which is in one location higher than the "i"th cell, are connected and a ground potential line; a voltage comparator that determines an existence, nonexistence or normality of the cells by comparing a voltage value of an (i+1)th cell that is in one location lower than the "i"th cell with the voltage value of the "i"th cell measured by the voltage measuring unit; and a cell number determination unit that determines a number of assembled cells and normal cells and cell assembled locations in the overall battery based on a comparison result of the voltage comparator.

It will be explained in detail. When the cell in which one terminal is connected to the ground potential line is a bottom-level Nth cell, the cell number determination unit may instruct the voltage measuring unit to measure a voltage between a terminal in which the Nth cell and the (N−1)th cell that is in one location higher than the Nth cell are connected and the ground potential line. When a voltage difference between a measurement result by the voltage measuring unit and the ground potential line is equal to or less than a predetermined threshold value, or is less than the predetermined threshold value, the cell number determination unit may instruct the voltage comparator to determine that the Nth cell is not assembled or has failed to operate properly even though the Nth cell is assembled. The cell number determination unit may instruct the voltage measuring unit to measure a voltage between a terminal in which the (N−1)th cell and an (N−2)th cell that is in one location higher than the (N−1)th cell are connected and the ground potential line. When a voltage difference between a measurement result by the voltage measuring unit and the measurement result of the voltage value of the Nth cell is equal to or less than a predetermined threshold value, or is less than the predetermined threshold value, the cell number determination unit may instruct the voltage comparator to determine that the (N−1)th cell is not assembled or has failed to operate properly even though the (N−1)th cell is assembled. A number of assembled cells and normal cells and cell assembled locations in the overall battery may be determined based on a result that is obtained by repeatedly executing the processing until an upper-level first cell through the voltage measuring unit and the voltage comparator.

In the cell number determination device according to the present invention, the single voltage measuring unit and the single voltage comparator may be provided, a selector switch that connects the N number of the terminals that are target for measurement for N number of the cells and the single voltage measuring unit through sequentially switching may be provided, and the single voltage comparator may store and compare a previous measurement result with a latest measurement result among measurement results of the cells that are sequentially output from the voltage measuring unit in accordance with switching the selector switch.

According to the second aspect of the present invention, there is provided a method for determining a cell number that is executed by a cell number determination device for determining a number of assembled cells and normal cells, and cell assembled locations in a battery configured with a plurality of cells, comprising: executing a voltage measuring step that selects an "i"th cell among a number N of cells that are connected in series and that configure the battery, and that measures a voltage value between a terminal in which the "i"th cell and an (i−1)th cell that is in one location higher than the "i"th cell are connected and a ground potential line; executing a voltage comparison step that determines existence or nonexistence, or normality of the cells by comparing a voltage value of an (i+1)th cell that is in one location lower than the "i"th cell with the voltage value of the "i"th cell measured by the voltage measuring unit; and executing a cell number determination step that determines a number of assembled cells and normal cells and cell assembled locations in the overall battery based on a comparison result of the voltage comparator through a cell number determination unit of the cell number determination device.

The processing of a cell number determination step executed by the cell number determination unit will be explained in detail. When the cell in which one terminal is connected to the ground potential line is a bottom-level Nth cell, the cell number determination unit may execute the voltage measuring step to measure a voltage between a terminal in which the Nth cell and the (N−1)th cell that is in one location higher than the Nth cell are connected and the ground potential line. When a voltage difference between a measurement result by the voltage measuring step and the ground potential line is equal to or less than a predetermined threshold value, or is less than the predetermined threshold value, the cell number determination unit may execute the voltage comparator step to determine that the Nth cell is not assembled or has failed to operate properly even though the Nth cell is assembled. The cell number determination unit may execute the voltage measuring step to measure a voltage between a terminal in which the (N−1)th cell and an (N−2)th cell that is in one location higher than the (N−1)th cell are connected and the ground potential line. When a voltage difference between a measurement result by the voltage measuring step and the measurement result of the voltage value of the Nth cell is equal to or less than a predetermined threshold value, or is less than the predetermined threshold value, the cell number determination unit may execute the voltage comparator step to determine that the (N−1)th cell is not assembled or has failed to operate properly even though the (N−1)th cell is assembled. A number of assembled cells and normal cells and cell assembled locations in the overall battery may be determined based on a result that is obtained by repeatedly executing the processing until an upper-level first cell through the voltage measuring step and the voltage comparator step.

According to the third aspect of the present invention, there is provided a power supply device comprising: the cell number determination device according to the present invention; and a battery with a plurality of cells, wherein the cell number determination unit determines the number of assembled cells and normal cells and cell assembled locations in the battery as power-on is a trigger.

It may be preferable that, when all determination results in which determinations are performed several times are the same, the cell number determination unit determines that the determination result is correct.

According to the fourth aspect of the present invention, there is provided a computer program that realizes a function of the cell number determination device according to the present invention in an information processing device by being installed in the information processing device.

According to the present invention, the number of cells can be understood before control for a battery without providing a cell number setting means and input means.

DETAILED DESCRIPTION OF THE PREFERRED EMBODIMENTS

Figure 1:
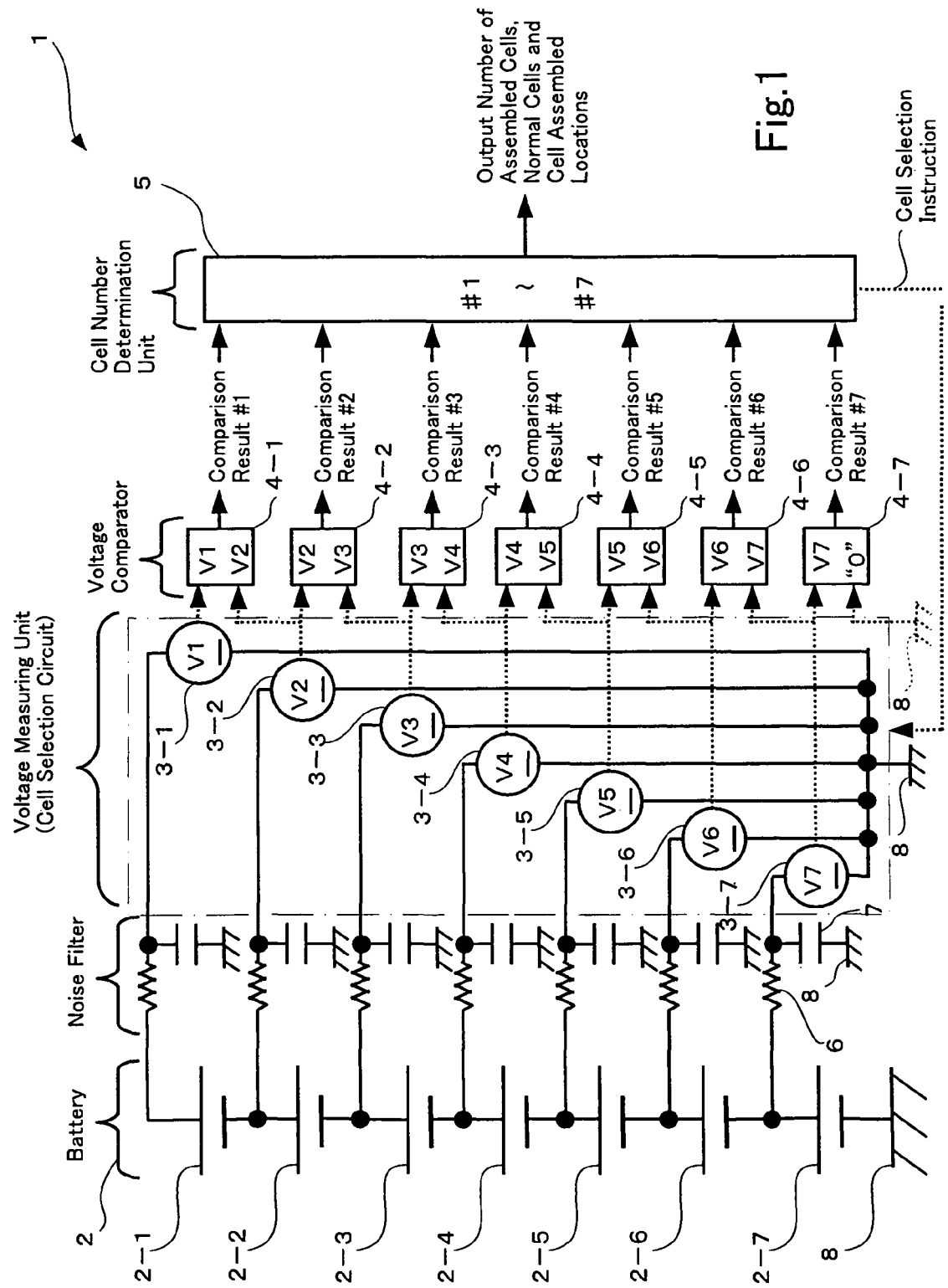
FIG. 1 is a block diagram of a power supply device according to a first embodiment of the present invention.

Configuration of Power Supply Device 1 According to First Embodiment of Present Invention A configuration of a power supply device 1 according to a first embodiment of the present invention is explained with reference to FIG. 1. FIG. 1 is a block diagram of the power supply device 1. The power supply device 1 has a battery 2 configured with seven cells 2-1 to 2-7, a maximum number of cells, voltage measuring units 3-1 to 3-7, voltage comparators 4-1 to 4-7, and a cell number determination unit 5. The power supply device 1 also has resistors 6 and capacitors 7 as a noise filter. Note that in the cells 2-1 to 2-7, the cell 2-7, which is directly connected to ground potential lines 8, is a bottom-level cell as a matter of convenience for explanation.

The cells 2-1 to 2-7 are, for example, lithium cells. In a lithium cell, one cell outputs a voltage value of approximately 4.1 V. Therefore, in an example in FIG. 1, the battery 2 with 28.7 V (4.1 V×7 cells) as a maximum value can be configured. In the example of FIG. 1, all seven cells are shown; however, the number of cells can be increased and decreased from one through seven. When the number of cells is sequentially increased from one, a normal increasing and decreasing method is as follows: the number of cells is sequentially increased from the bottom-level cell 2-7, which is directly connected to the ground potential line 8, toward an upper-level cell.

The voltage measuring units 3-1 to 3-7 are provided to correspond to the cells 2-1 to 2-7, respectively. The voltage measuring units 3-1 to 3-7 also function as a cell selection circuit. In other words, any of the seven voltage measuring units 3-1 to 3-7 measures a voltage value of any of the cells 2-1 to 2-7 in accordance with a cell selection instruction from the cell number determination unit 5. Usually, the cell number determination unit 5 sequentially selects a cell from the bottom-level cell 2-7 toward the upper-level cell 2-1 so that its voltage value is measured.

As discussed above, the voltage measuring unit 3-7 measures a voltage between a terminal in which the cell 2-7 is connected to the cell 2-6 and the ground potential line 8. The voltage measuring unit 3-6 measures a voltage between a terminal in which the cell 2-6 is connected to the cell 2-5 and the ground potential line 8. The voltage measuring unit 3-5 measures a voltage between a terminal in which the cell 2-5 is connected to the cell 2-4 and the ground potential line 8. The voltage measuring unit 3-4 measures a voltage between a terminal in which the cell 2-4 is connected to the cell 2-3 and the ground potential line 8. The voltage measuring unit 3-3 measures a voltage between a terminal in which the cell 2-3 is connected to the cell 2-2 and the ground potential line 8. The voltage measuring unit 3-2 measures a voltage between a terminal in which the cell 2-2 is connected to the cell 2-1 and the ground potential line 8. The voltage measuring unit 3-1 measures a voltage between a terminal of the cell 2-1 that is not connected to the cell 2-2 and the ground potential line 8.

The voltage comparators 4-1 to 4-7 are provided to correspond to the voltage measuring units 3-1 to 3-7, respectively. Therefore, the voltage comparator 4-7 compares a voltage value "0" (V) of the ground potential line 8 with a voltage value V7 (V) measured by the voltage measuring unit 3-7. The voltage comparator 4-6 compares the voltage value V7 (V) measured by the voltage measuring unit 3-7 with a voltage value V6 (V) measured by the voltage measuring unit 3-6. The voltage comparator 4-5 compares the voltage value V6 (V) measured by the voltage measuring unit 3-6 with a voltage value V5 (V) measured by the voltage measuring unit 3-5. The voltage comparator 4-4 compares the voltage value V5 (V) measured by the voltage measuring unit 3-5 with a voltage value V4 (V) measured by the voltage measuring unit 3-4. The voltage comparator 4-3 compares the voltage value V4 (V) measured by the voltage measuring unit 3-4 with a voltage value V3 (V) measured by the voltage measuring unit 3-3. The voltage comparator 4-2 compares the voltage value V3 (V) measured by the voltage measuring unit 3-3 with a voltage value V2 (V) measured by the voltage measuring unit 3-2. The voltage comparator 4-1 compares the voltage value V2 (V) measured by the voltage measuring unit 3-2 with a voltage value V1 (V) measured by the voltage measuring unit 3-1.

Comparison results of the voltage comparators 4-1 to 4-7 are input into the cell number determination unit 5. Then, the cell number determination unit 5 outputs the number of assembled cells and normal cells and cell assembled locations in the battery 2 by comprehensively determining these various comparison results.

The resistor 6 and the capacitor 7 as the noise filter are provided because measuring values of the voltage measuring units 3-1 to 3-7 are not affected by disturbances, such as a surge.

[Operation of Power Supply Device 1]

Operation of the power supply device 1 is explained with reference to FIGS. 2-8. First of all, the voltage measuring unit 3-7 measures the voltage value V7 between the terminal in which the cell 2-7 is connected to the cell 2-6 and the ground potential line 8. The measurement results are input to the voltage comparator 4-7. In the voltage comparator 4-7, the voltage value V7 of the cell 2-7 input from the voltage measuring unit 3-7 is stored in a memory (not shown).

The voltage comparator 4-7 compares the voltage value "0" (V) of the ground potential line 8 with the voltage value V7 (V) of the cell 2-7 stored in the memory. When the comparison results, i.e. a voltage difference between the voltage value V7 and the voltage value "0," are equal to or less than a predetermined threshold value, or are less than the predetermined threshold value, the voltage comparator 4-7 determines that the cell 2-7 is not assembled or has failed to operate properly. The predetermined threshold value is, for example, approximately 0.2 V for a lithium cell. In other words, it is preferred that the predetermined threshold value is a measurable voltage value even though the cells 2-1 to 2-7 are in completely discharged states. The voltage comparator 4-7 transfers the voltage value V7 stored in the memory to a memory (not shown) of the voltage comparator 4-6. In the voltage comparator 4-6, since the voltage value V7 transferred from the voltage comparator 4-7 is a hypothetical ground potential, a voltage value of the cell 2-6 itself can be examined by subtracting the voltage value V7 from the voltage value V6 of the cell 2-6.

The voltage measuring unit 3-6 measures the voltage value V6 between the terminal in which the cell 2-6 is connected to the cell 2-5 and the ground potential line 8. The measurement results are input to the voltage comparator 4-6. In the voltage comparator 4-6, the voltage value V6 of the cell 2-6 input from the voltage measuring unit 3-6 is stored in a memory (not shown).

The voltage comparator 4-6 compares the voltage value V7 of the cell 2-7 that is transferred from the voltage comparator 4-7 and that is stored in the memory with the voltage value V6 (V) of the cell 2-6 that is input from the voltage measuring unit 3-6 and that is stored in the memory. When the comparison results, i.e. a voltage difference between the voltage value V6 and the voltage value V7, are equal to or less than the predetermined threshold value, or are less than the predetermined threshold value, the voltage comparator 4-6 determines that the cell 2-6 is not assembled or has failed to operate properly. The voltage comparator 4-6 transfers the voltage value V6 stored in the memory to a memory (not shown) of the voltage comparator 4-5. In the voltage comparator 4-5, since the voltage value V6 transferred from the voltage comparator 4-6 is a hypothetical ground potential, a voltage value of the cell 2-5 itself can be examined by subtracting the voltage value V6 from the voltage value V5 of the cell 2-5.

Similarly, the voltage measuring unit 3-5 measures the voltage value V5 between the terminal in which the cell 2-5 is connected to the cell 2-4 and the ground potential line 8. The measurement results are input to the voltage comparator 4-5. In the voltage comparator 4-5, the voltage value V5 of the cell 2-5 input from the voltage measuring unit 3-5 is stored in a memory (not shown).

The voltage comparator 4-5 compares the voltage value V6 of the cell 2-6 that is transferred from the voltage comparator 4-6 and that is stored in the memory with the voltage value V5 (V) of the cell 2-5 that is input from the voltage measuring unit 3-5 and that is stored in the memory. When the comparison results, i.e. a voltage difference between the voltage value V5 and the voltage value V6, are equal to or less than the predetermined threshold value, or are less than the predetermined threshold value, the voltage comparator 4-5 determines that the cell 2-5 is not assembled or has failed to operate properly. The voltage comparator 4-5 transfers the voltage value. V5 stored in the memory to a memory (not shown) of the voltage comparator 4-4. In the voltage comparator 4-4, since the voltage value V5 transferred from the voltage comparator 4-5 is a hypothetical ground potential, a voltage value of the cell 2-4 itself can be examined by subtracting the voltage value V5 from the voltage value V4 of the cell 2-4.

Similarly, the voltage measuring unit 3-4 measures the voltage value V4 between the terminal in which the cell 2-4 is connected to the cell 2-3 and the ground potential line 8. The measurement results are input to the voltage comparator 4-4. In the voltage comparator 4-4, the voltage value V4 of the cell 2-4 input from the voltage measuring unit 3-4 is stored in a memory (not shown).

The voltage comparator 4-4 compares the voltage value V5 of the cell 2-5 that is transferred from the voltage comparator 4-5 and that is stored in the memory with the voltage value V4 (V) of the cell 2-4 that is input from the voltage measuring unit 3-4 and that is stored in the memory. When the comparison results, i.e. a voltage difference between the voltage value V4 and the voltage value V5, are equal to or less than the predetermined threshold value, or are less than the predetermined threshold value, the voltage comparator 4-4 determines that the cell 2-4 is not assembled or has failed to operate properly. The voltage comparator 4-4 transfers the voltage value V4 stored in the memory to a memory (not shown) of the voltage comparator 4-3. In the voltage comparator 4-3, since the voltage value V4 transferred from the voltage comparator 4-4 is a hypothetical ground potential, a voltage value of the cell 2-3 itself can be examined by subtracting the voltage value V4 from the voltage value V3 of the cell 2-3.

Similarly, the voltage measuring unit 3-3 measures the voltage value V3 between the terminal in which the cell 2-3 is connected to the cell 2-2 and the ground potential line 8. The measurement results are input to the voltage comparator 4-3. In the voltage comparator 4-3, the voltage value V3 of the cell 2-3 input from the voltage measuring unit 3-3 is stored in a memory (not shown).

The voltage comparator 4-3 compares the voltage value V4 of the cell 2-4 that is transferred from the voltage comparator 4-4 and that is stored in the memory with the voltage value V3 (V) of the cell 2-3 that is input from the voltage measuring unit 3-3 and that is stored in the memory. When the comparison results, i.e. a voltage difference between the voltage value V3 and the voltage value V4, are equal to or less than the predetermined threshold value, or are less than the predetermined threshold value, the voltage comparator 4-3 determines that the cell 2-3 is not assembled or has failed to operate properly. The voltage comparator 4-3 transfers the voltage value V3 stored in the memory to a memory (not shown) of the voltage comparator 4-2. In the voltage comparator 4-2, since the voltage value V3 transferred from the voltage comparator 4-3 is a hypothetical ground potential, a voltage value of the cell 2-2 itself can be examined by subtracting the voltage value V3 from the voltage value V2 of the cell 2-2.

Similarly, the voltage measuring unit 3-2 measures the voltage value V2 between the terminals in which the cell 2-2 is connected to the cell 2-1 and the ground potential line 8. The measurement results are input to the voltage comparator 4-2. In the voltage comparator 4-2, the voltage value V2 of the cell 2-2 input from the voltage measuring unit 3-2 is stored in a memory (not shown).

The voltage comparator 4-2 compares the voltage value V3 of the cell 2-3 that is transferred from the voltage comparator 4-3 and that is stored in the memory with the voltage value V2 (V) of the cell 2-2 that is input from the voltage measuring unit 3-2 and that is stored in the memory. When the comparison results, i.e. a voltage difference between the voltage value V2 and the voltage value V3, are equal to or less than the predetermined threshold value, or are less than the predetermined threshold value, the voltage comparator 4-2 determines that the cell 2-2 is not assembled or has failed to operate properly. The voltage comparator 4-2 transfers the voltage value V2 stored in the memory to a memory (not shown) of the voltage comparator 4-1. In the voltage comparator 4-1, since the voltage value V2 transferred from the voltage comparator 4-2 is a hypothetical ground potential, a voltage value of the cell 2-1 itself can be examined by subtracting the voltage value V2 from the voltage value V1 of the cell 2-1.

Similarly, the voltage measuring unit 3-1 measures the voltage value V1 between the terminal of the cell 2-1 that is not connected to the cell 2-2 and the ground potential line 8. The measurement results are input to the voltage comparator 4-1. In the voltage comparator 4-1, the voltage value V1 of the cell 2-1 input from the voltage measuring unit 3-1 is stored in a memory (not shown).

The voltage comparator 4-1 compares the voltage value V2 of the cell 2-2 that is transferred from the voltage comparator 4-2 and that is stored in the memory with the voltage value V1 (V) of the cell 2-1 that is input from the voltage measuring unit 3-1 and that is stored in the memory. When the comparison results, i.e. a voltage difference between the voltage value V1 and the voltage value V2, are equal to or less than the predetermined threshold value, or are less than the predetermined threshold value, the voltage comparator 4-1 determines that the cell 2-1 is not assembled or has failed to operate properly.

Figure 2:
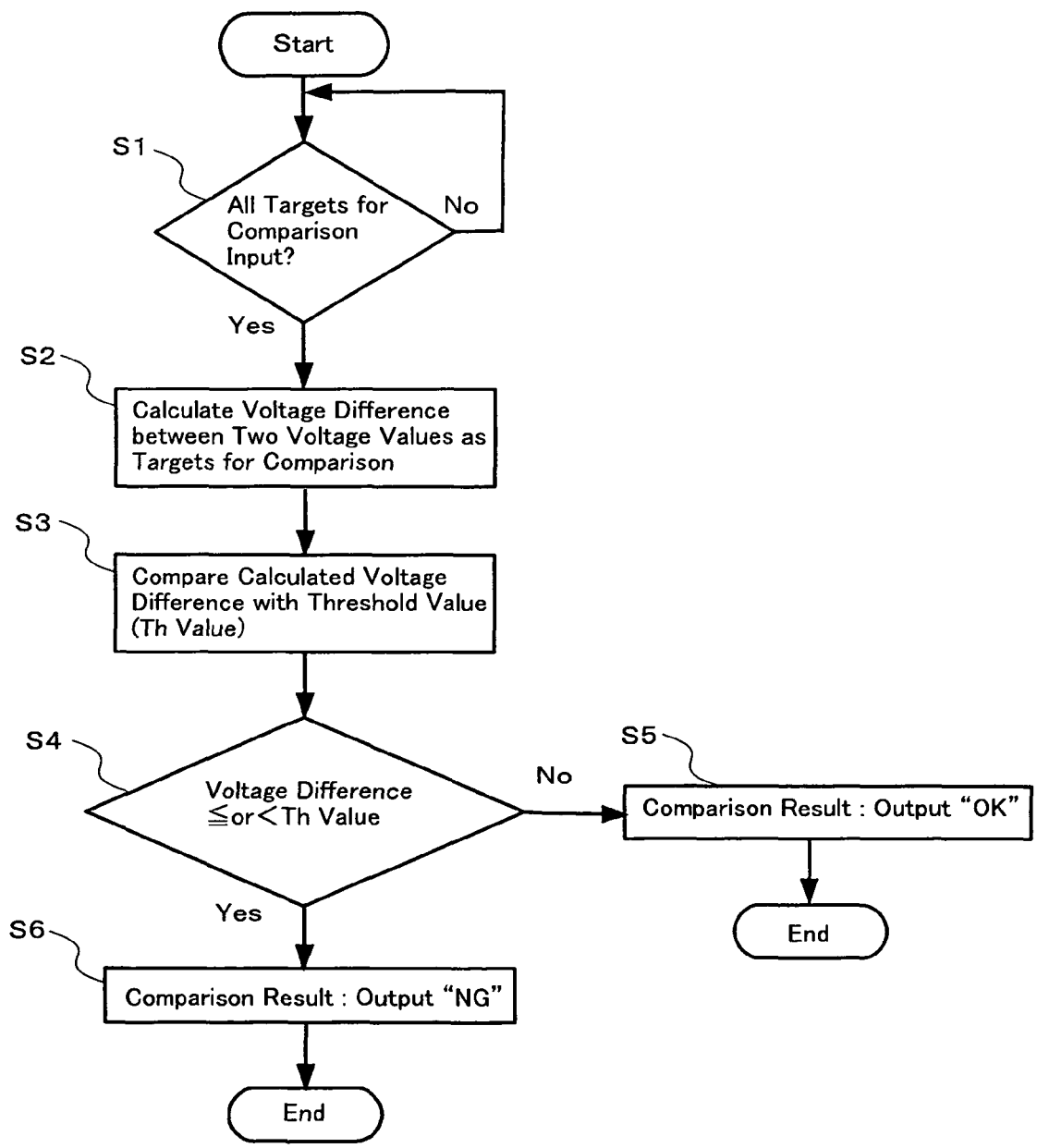
FIG. 2 is a flow diagram showing an operating procedure of a voltage comparator shown in FIG. 1.

FIG. 2 shows a flow diagram of the operating procedures of the voltage comparators 4-1 to 4-7. Note that when a common explanation for each of the voltage comparators 4-1 to 4-7 is given, it is explained as a voltage comparator 4.

START: When power of the power supply device 1 is turned on, the voltage comparator 4 proceeds to S1.

S1: The voltage comparator 4 determines whether or not two voltage values as targets for comparison are stored in a memory. When the two voltage values as the targets for comparison are stored in the memory (Yes at S1), the voltage comparator 4 proceeds to S2. In the other hand, when the two voltage values as the targets for comparison are not stored in the memory (No at S1), the voltage comparator 4 repeats S1.

S2: The voltage comparator 4 calculates a voltage difference between the two voltage values, and processing proceeds to S3.

S3: The voltage comparator 4 compares the calculated voltage difference with a threshold value, and processing proceeds to S4.

S4: The voltage comparator 4 determines whether or not the voltage difference is equal to or less than the threshold value, or is less than the threshold value. When the voltage difference is equal to or less than the threshold value, or is less than the threshold value (Yes at S4), the voltage comparator 4 proceeds to S6. On the other hand, when the voltage difference is more than the threshold value, or is equal to or more than the threshold value (No at S4), the voltage comparator 4 proceeds to S5.

S5: The voltage comparator 4 outputs "OK" as comparison results, and processing ends (END).

S6: The voltage comparator 4 outputs "NG (no-good)" as the comparison results, and processing ends (END).

As discussed above, the comparison results output from the voltage comparators 4-1 to 4-7 are input into the cell number determination unit 5.

Figure 3:
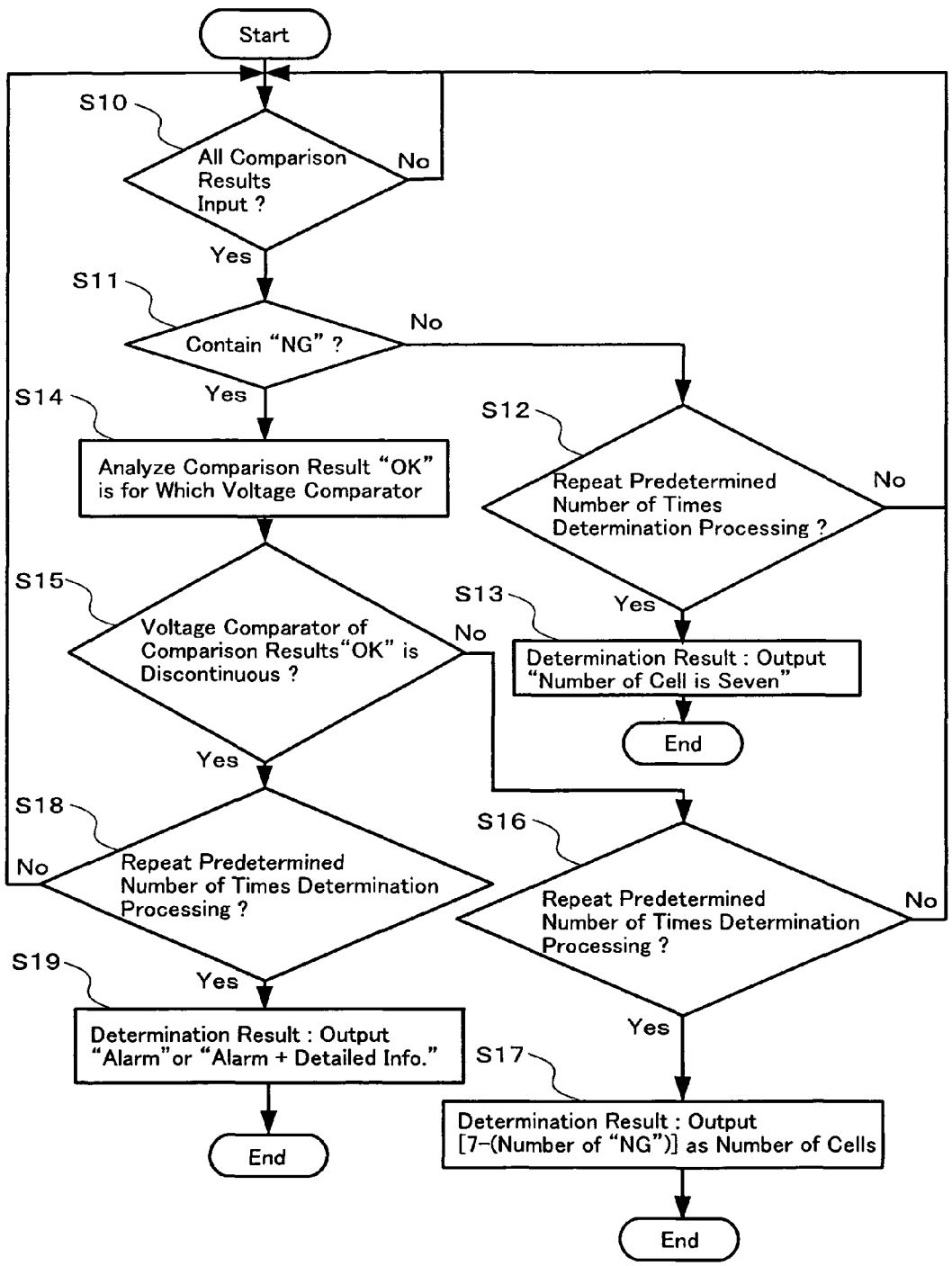
FIG. 3 is a flow diagram showing a determination processing procedure of a cell number determination unit shown in FIG. 1.

A determination processing procedure of the cell number determination unit 5 is shown in a flow diagram of FIG. 3.

START: When power of the power supply device 1 is turned on, the cell number determination unit 5 proceeds to S10.

S10: The cell number determination unit 5 determines whether or not all the comparison results from the voltage comparators 4-1 to 4-7 are input. When all the comparison results from the voltage comparators 4-1 to 4-7 are input (Yes at S10), the cell number determination unit 5 proceeds to S11. On the other hand, part of the comparison results from the voltage comparators 4-1 to 4-7 is not input (No at S10), the cell number determination unit 5 repeats S10.

S11: The cell number determination unit 5 determines whether or not "NG" is contained in the comparison results. When "NG" is contained in the comparison results (Yes at S11), the cell number determination unit 5 proceeds to S14. On the other hand, when "NG" is not contained in the comparison results (No at S11), the cell number determination unit 5 proceeds to S12.

S12: The cell number determination unit 5 determines whether or not predetermined number of times determination processing is repeated. Note that the predetermined number of times is, for example, four times. Because determination results based on a plurality of determination processing increase reliability more than one based on only one time of determination processing, processing of S12, and S16 and S18, which are discussed later, are for increasing reliability of the determination results. When the predetermined number of times the determination processing is repeated (Yes at S12), the cell number determination unit 5 instructs processing to proceed to S13. On the other hand, when the predetermined number of times the determination processing is not repeated (No at S12), the cell number determination unit 5 instructs processing to return to S10. For example, a repeat cycle is 250 ms (milliseconds).

S13: The cell number determination unit 5 outputs the determination results, "number of cells is seven," and then instructs processing to end (END).

S14: The cell number determination unit 5 analyzes that "OK" as the comparison results are for which of the voltage comparators 4-1 to 4-7, and then instructs processing to proceed to S15.

S15: The cell number determination unit 5 determines whether or not the voltage comparators 4-1 to 4-7 in which the comparison results are "OK" are discontinuous in a direction from the bottom-level voltage comparator 4-7 as the head toward the upper-level voltage comparator 4-1. When the voltage comparators 4-1 to 4-7 in which the comparison results are "OK" are discontinuous in the direction from the bottom-level voltage comparator 4-7 as the head toward the upper-level voltage comparator 4-1 (Yes at S15), the cell number determination unit 5 instructs processing to proceed to S18. On the other hand, the voltage comparators 4-1 to 4-7 in which the comparison results are "OK" are continuous in the direction from the bottom-level voltage comparator 4-7 as the head toward the upper-level voltage comparator 4-1 (No at S15), the cell number determination unit 5 instructs processing to proceed to S16.

S16: The cell number determination unit 5 determines whether or not the predetermined number of times the determination processing is repeated. When the predetermined number of times the determination processing is repeated (Yes at S16), the cell number determination unit 5 instructs processing to proceed to S17. On the other hand, when the predetermined number of times the determination processing is not repeated (No at S16), the cell number determination unit 5 instructs processing to return to S10.

S17: The cell number determination unit 5 outputs determination results of the number of cells that is calculated by subtracting the number of "NG" from "7" [7−(number of "NG")], and then instructs processing to end (END).

S18: The cell number determination unit 5 determines whether or not the predetermined number of times the determination processing is repeated. When the predetermined number of times the determination processing is repeated (Yes at S18), the cell number determination unit 5 instructs processing to proceed to S19. On the other hand, when the predetermined number of times the determination processing is not repeated (No at S18), the cell number determination unit 5 instructs processing to return to S10.

S19: The cell number determination unit 5 outputs an "alarm" for notifying a user about an abnormality as the determination results, and then instructs processing to end (END). In this case, as detailed information for notifying the user, "Xth cell is abnormal" or "Xth cell is required to check" may be also output along with the "alarm."

As a display method for the detailed information, for example, seven light emitting diodes (LEDs) are provided at the power supply device 1 so that it is possible that the LED that corresponds to an "NG" cell is turned on (or turned off). The user can know the number of assembled cells, normal cells and cell assembled locations by referring to the LEDs' on and off states.

Determination results of the cell number determination unit 5 corresponding to various conditions of the cells 2-1 to 2-7 of the battery 2 are explained.

Figure 4:
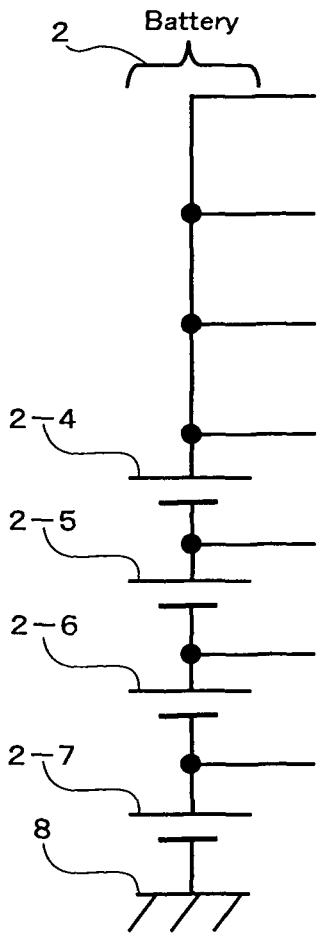
FIG. 4 is a schematic view of a battery having four cells for explaining operation of a power supply device shown in FIG. 1.

FIG. 4 shows an example state in which four cells 2-4 to 2-7 are assembled in the battery 2. In the state shown in FIG. 4, when the cells 2-4 to 2-7 are normal, comparison results of the voltage comparators 4-4 to 4-7 are "OK," and comparison results of the voltage comparators 4-1 to 4-3 are "NG." The cell number determination unit 5 determines that the voltage comparators 4-4 to 4-7 in which the comparison results are "OK" are continuous in the direction from the bottom-level voltage comparator 4-7 as the head toward the upper-level voltage comparator 4-1 in accordance with the determination processing at S15 in the flow diagram of FIG. 3, and then outputs the determination results of the number of cells that is calculated by subtracting the number of "NG" from "7" [7−(number of "NG")] in accordance with the processing at S17 in the flow diagram of FIG. 3. In other words, the cell number determination unit 5 outputs "number of cells is four" as the determination results.

Figure 5:
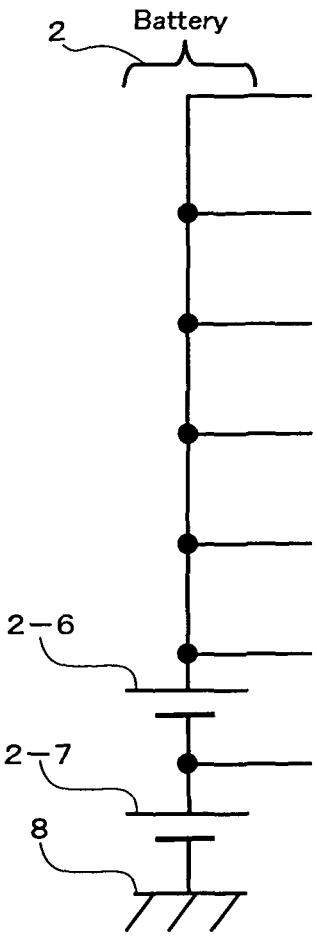
FIG. 5 is a schematic view of a battery having two cells for explaining operation of a power supply device shown in FIG. 1.

FIG. 5 shows an example state in which two cells 2-6 to 2-7 are assembled in the battery 2. In the state shown in FIG. 5, when the cells 2-6 to 2-7 are normal, comparison results of the voltage comparators 4-6 to 4-7 are "OK," and comparison results of the voltage comparators 4-1 to 4-5 are "NG." The cell number determination unit 5 determines that the voltage comparators 4-6 to 4-7 in which the comparison results are "OK" are continuous in the direction from the bottom-level voltage comparator 4-7 as the head toward the upper-level voltage comparator 4-1 in accordance with the determination processing at S15 in the flow diagram of FIG. 3, and then outputs the determination results of the number of cells that is calculated by subtracting the number of "NG" from "7" [7−(number of "NG")] in accordance with the processing at S17 in the flow diagram of FIG. 3. In other words, the cell number determination unit 5 outputs "number of cells is two" as the determination results.

Figure 6:
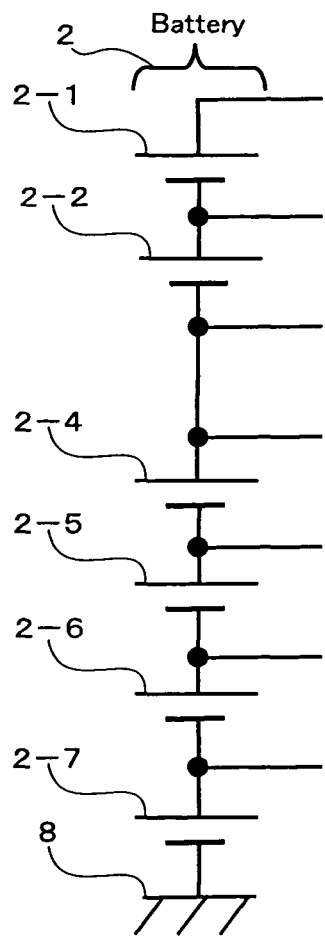
FIG. 6 is a schematic view of a state in which one cell among seven cells is removed for explaining operation of a power supply device shown in FIG. 1.

FIG. 6 shows an example state in which one cell 2-3 is not assembled in the battery 2. In the state shown in FIG. 6, when the cells 2-1, 2-2, and 2-4 to 2-7 are normal, comparison results of the voltage comparators 4-1, 4-2, and 4-4 to 4-7 are "OK," and comparison results of the voltage comparators 4-3 are "NG." The cell number determination unit 5 determines that the voltage comparators 4-1, 4-2, and 4-4 to 4-7 in which the comparison results are "OK" are not continuous in the direction from the bottom-level voltage comparator 4-7 as the head toward the upper-level voltage comparator 4-1 in accordance with the determination processing at S15 in the flow diagram of FIG. 3. Therefore, the cell number determination unit 5 outputs the "alarm" for notifying a user about an abnormality as the determination results in accordance with the processing at S19 in the flow diagram of FIG. 3. In this case, as detailed information for notifying the user, "third cell is abnormal" or "third cell is required to check" may also be output along with the "alarm." For example, the LED that corresponds to the cell 2-3 among seven LEDs is turned on (or turned off).

Figure 7:
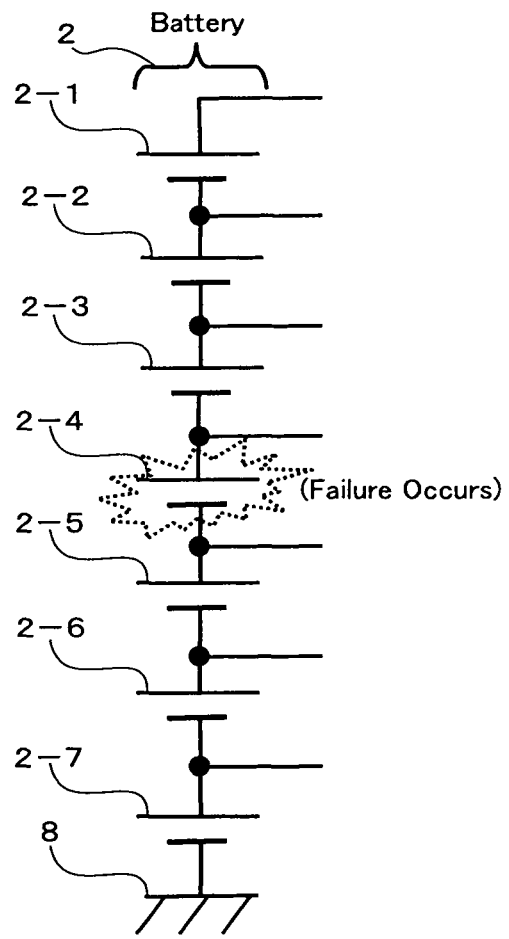
FIG. 7 is a schematic view of a state in which a failure occurs in one cell among seven cells for explaining operation of a power supply device shown in FIG. 1.

FIG. 7 shows an example state in which one cell 2-4 has failed in the battery 2. In the state shown in FIG. 7, when the cells 2-1 to 2-3 and 2-5 to 2-7 are normal, comparison results of the voltage comparators 4-1 to 4-3 and 4-5 to 4-7 are "OK," and comparison results of the voltage comparators 4-4 are "NG." The cell number determination unit 5 determines that the voltage comparators 4-1 to 4-3 and 4-5 to 4-7 in which the comparison results are "OK" are not continuous in the direction from the bottom-level voltage comparator 4-7 as the head toward the upper-level voltage comparator 4-1 in accordance with the determination processing at S15 in the flow diagram of FIG. 3. Therefore, the cell number determination unit 5 outputs the "alarm" for notifying the user about an abnormality as the determination results in accordance with the processing at S19 in the flow diagram of FIG. 3. In this case, as detailed information for notifying the user, "fourth cell is abnormal" or "fourth cell is required to check" may also be output along with the "alarm." For example, the LED that corresponds to the cell 2-4 among seven LEDs is turned on (or turned off).

Figure 8:
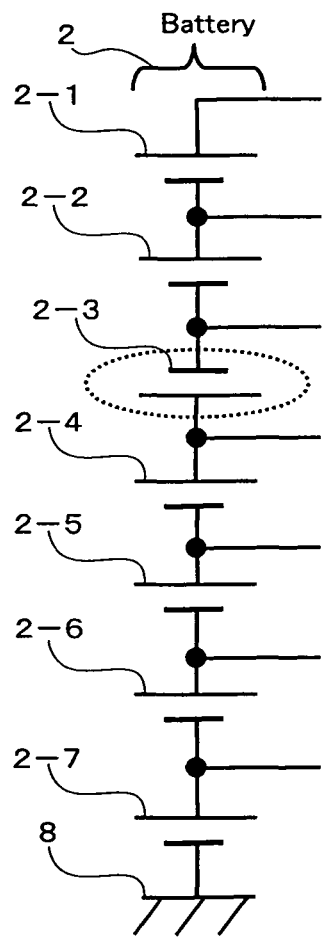
FIG. 8 is a schematic view of a state in which improper connection exists in one cell among seven cells for explaining operation of a power supply device shown in FIG. 1.

FIG. 8 shows an example state in which one cell 2-3 is improperly connected in the battery 2. In the state shown in FIG. 8, when the cells 2-1, 2-2, and 2-4 to 2-7 are normal, comparison results of the voltage comparators 4-1, 4-2, and 4-4 to 4-7 are "OK," and comparison results of the voltage comparators 4-3 are "NG." The cell number determination unit 5 determines that the voltage comparators 4-1, 4-2, and 4-4 to 4-7 in which the comparison results are "OK" are not continuous in the direction from the bottom-level voltage comparator 4-7 as the head toward the upper-level voltage comparator 4-1 in accordance with the determination processing at S15 in the flow diagram of FIG. 3. Therefore, the cell number determination unit 5 outputs the "alarm" for notifying the user about an abnormality as the determination results in accordance with the processing at S19 in the flow diagram of FIG. 3. In this case, as detailed information for notifying the user, "third cell is abnormal" or "third cell is required to check" may also be output along with the "alarm." For example, the LED that corresponds to the cell 2-3 among seven LEDs is turned on (or turned off).

Further in the example of FIG. 8, because the improper connection is based on reversal of the polarity for the cell 2-3, there is a peculiar state in which the measurement result V3 of the voltage measuring unit 3-3 is lower than the measurement result V4 of the voltage measuring unit 3-4. As a result, in the voltage comparator 4-3, the results obtained by subtracting the measurement result V4 from the measurement result V3 are negative (minus). In this case, since it is clearly understood that the improper connection occurs due to reversal of the polarity for the cell 2-3, the voltage comparator 4-4 may output not only simple "OK" and "NG" as the comparison results, but also other outputs, such as "MISS" or "− (minus)" showing the improper connection. When the cell number determination unit 5 receives these comparison results, "MISS," "− (minus)," or the like, the cell number determination unit 5 may perform to display a notification to the user about the "improper connection" along with the "alarm."

As a display method for the detailed information, for example, seven LEDs are provided at the power supply device 1 so that it is possible that the LED that corresponds to the "improper connection" cell is turned on with a different color than the previous LED, or blinks with a short cycle. The user can determine the improper connection of a cell by referring to the LEDs' turning on or blinking states.

Power Supply Device 1A According to Second Embodiment of Present Invention

A power supply device 1A according to a second embodiment of the present invention is explained with reference to FIGS. 9-14. FIGS. 9-12 are schematic views having a block diagram and operation explaining diagram of the power supply device 1A. The power supply device 1A is different from the power supply device 1 in part. The same or similar members as the first embodiment are explained with the same or similar system reference numerals, are omitted from the explanation or are simplistically explained. And, different members are mainly explained.

The power supply device 1A has one each of the following: a voltage measuring unit 3A, a voltage comparator 4A, and a cell number determination unit 5A. In contrast, the power supply device 1 has seven (which corresponds to a maximum number of cells) voltage measuring units 3-1 to 3-7 and seven voltage comparators 4-1 to 4-7. However, these voltage measuring units 3-1 to 3-7 and voltage comparators 4-1 to 4-7 are not operated at the same time. Therefore, in the power supply device 1A, functions that correspond to the seven voltage measuring units 3-1 to 3-7 and the seven voltage comparators 4-1 to 4-7 of the power supply device 1 are realized by the single voltage measuring unit 3A and the single voltage comparator 4A.

Figure 9:
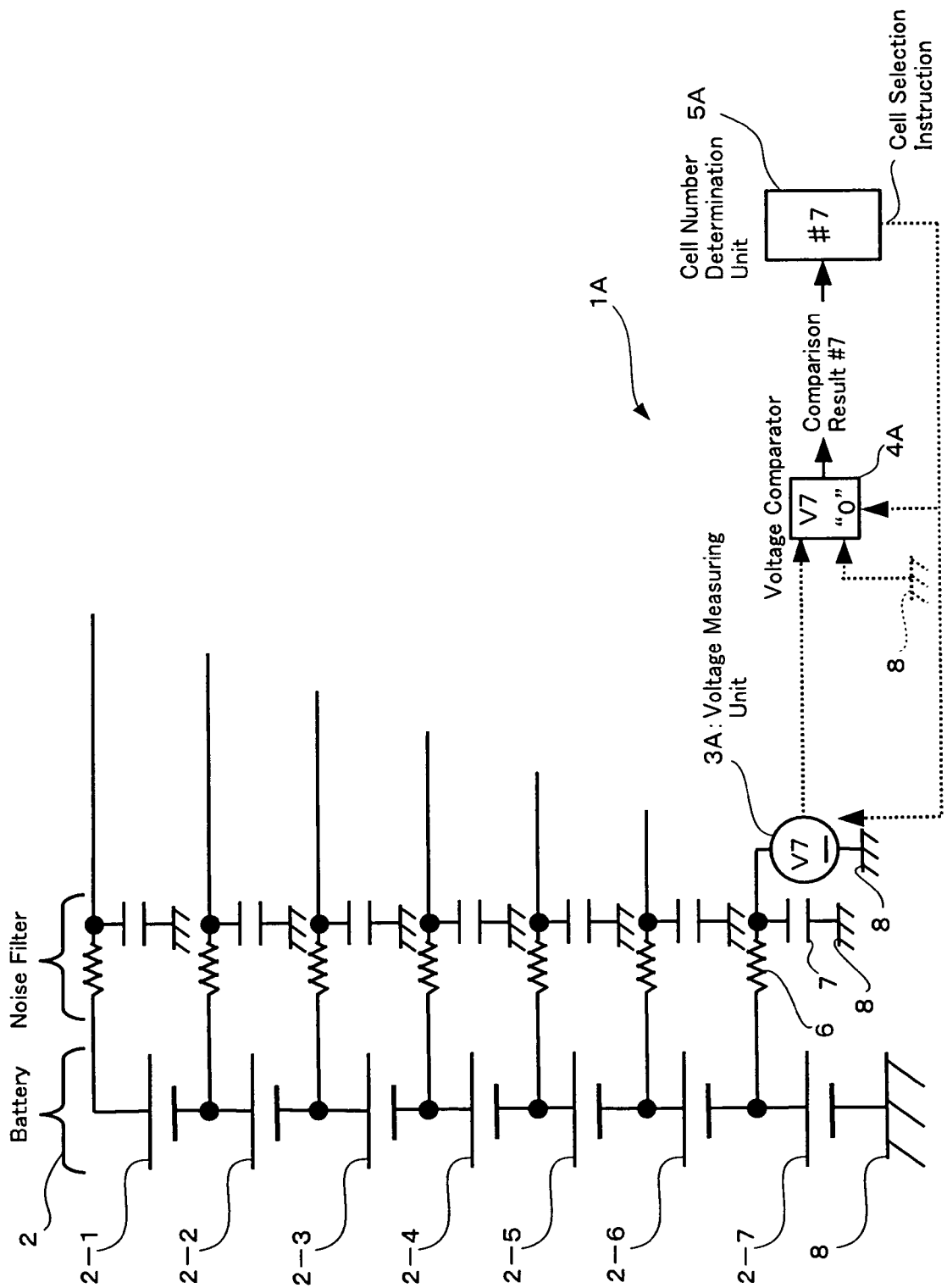
FIG. 9 is a schematic view having a block diagram and operation explaining diagram of a power supply device according to a second embodiment of the present invention.

In the power supply device 1A of FIG. 9, the cell number determination unit 5A outputs a cell selection instruction to the voltage measuring unit 3A so that the voltage measuring unit 3A measures the voltage value V7 of the cell 2-7 in accordance with the cell selection instruction. In this case, "0" (V) of the ground potential line 8 and the voltage value V7 (V) as the measurement results of the cell 2-7 are stored in the voltage comparator 4A. The voltage comparator 4A compares the results obtained by subtracting the stored voltage value "0" from the stored voltage value V7 with the predetermined threshold value and outputs the comparison result #7 to the cell number determination unit 5A.

Figure 10:
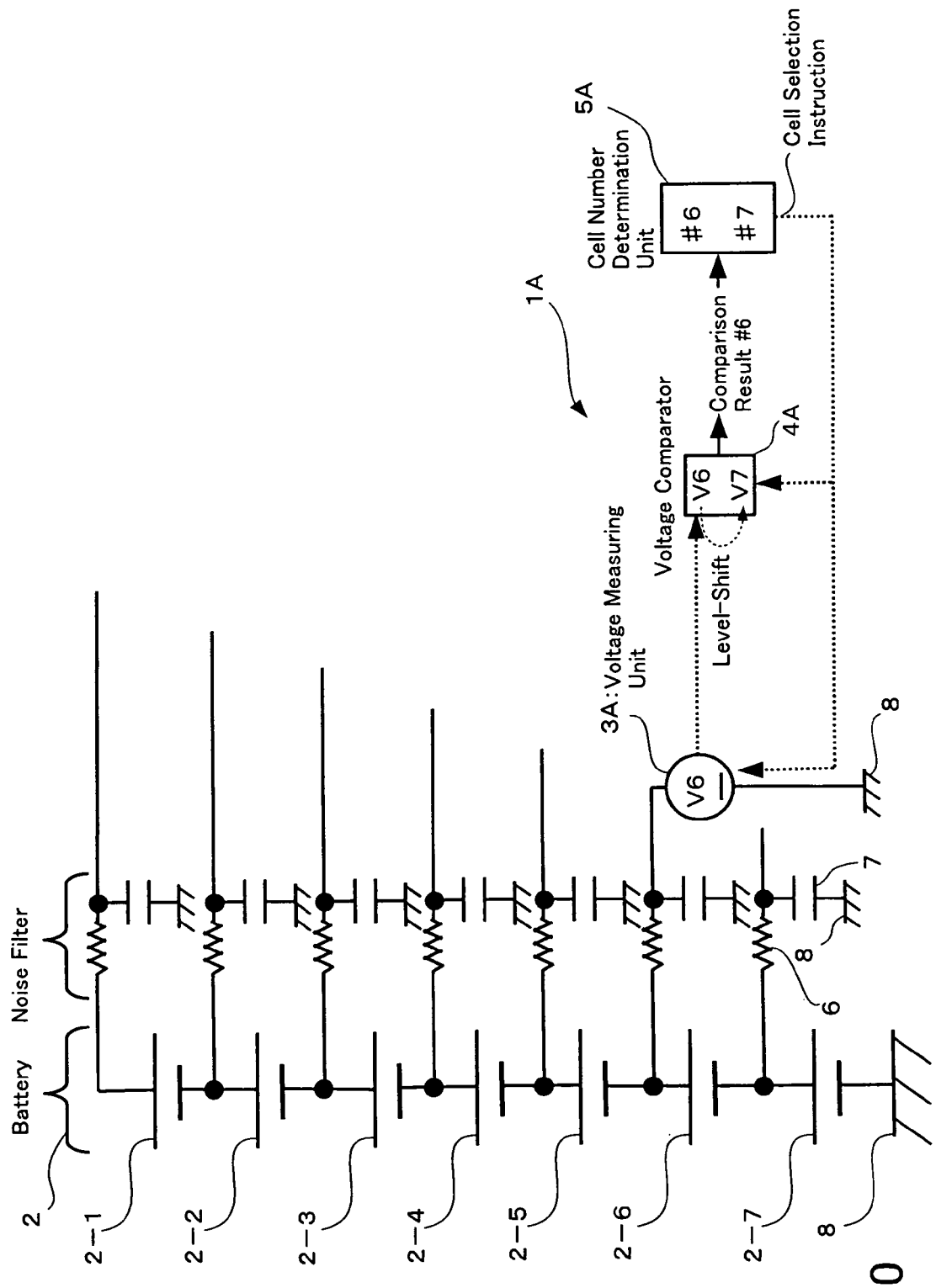
FIG. 10 is a schematic view having a block diagram and operation explaining diagram of a power supply device according to a second embodiment of the present invention.

In the power supply device 1A of FIG. 10, the cell number determination unit 5A outputs the cell selection instruction to the voltage measuring unit 3A so that the voltage measuring unit 3A measures the voltage value V6 of the cell 2-6 in accordance with the cell selection instruction. In this case, the voltage value V7 (V) of the cell 2-7 that was previously measured and the voltage value V6 (V) as the measurement results of the cell 2-6 are stored in the voltage comparator 4A.

The voltage value V6 (V) of the cell 2-6 that is measured at this time is contained in a memory area (upper portion in the drawing) where the voltage value V7 (V) of the cell 2-7 that was measured at the last time was contained. The voltage value V7 (V) of the cell 2-7 that was measured at the last time moves to a memory area (lower portion in the drawing) where the voltage value "0" of the ground potential line 8 was contained. As discussed above, a move of a voltage value is referred to as a level-shift. As a result, a voltage value that is subtracted as the ground potential or a voltage value deemed as a hypothetical ground potential is stored in a predetermined memory area (lower portion in the drawing) in the voltage comparator 4A. A level-shift processing of the voltage comparator 4A is performed by receiving the cell number selection instruction from the cell number determination unit 5 as a trigger.

The voltage comparator 4A compares the results obtained by subtracting the stored voltage value V7 from the stored voltage value V6 with the predetermined threshold value and outputs the comparison result #6 to the cell number determination unit 5A.

Figure 11:
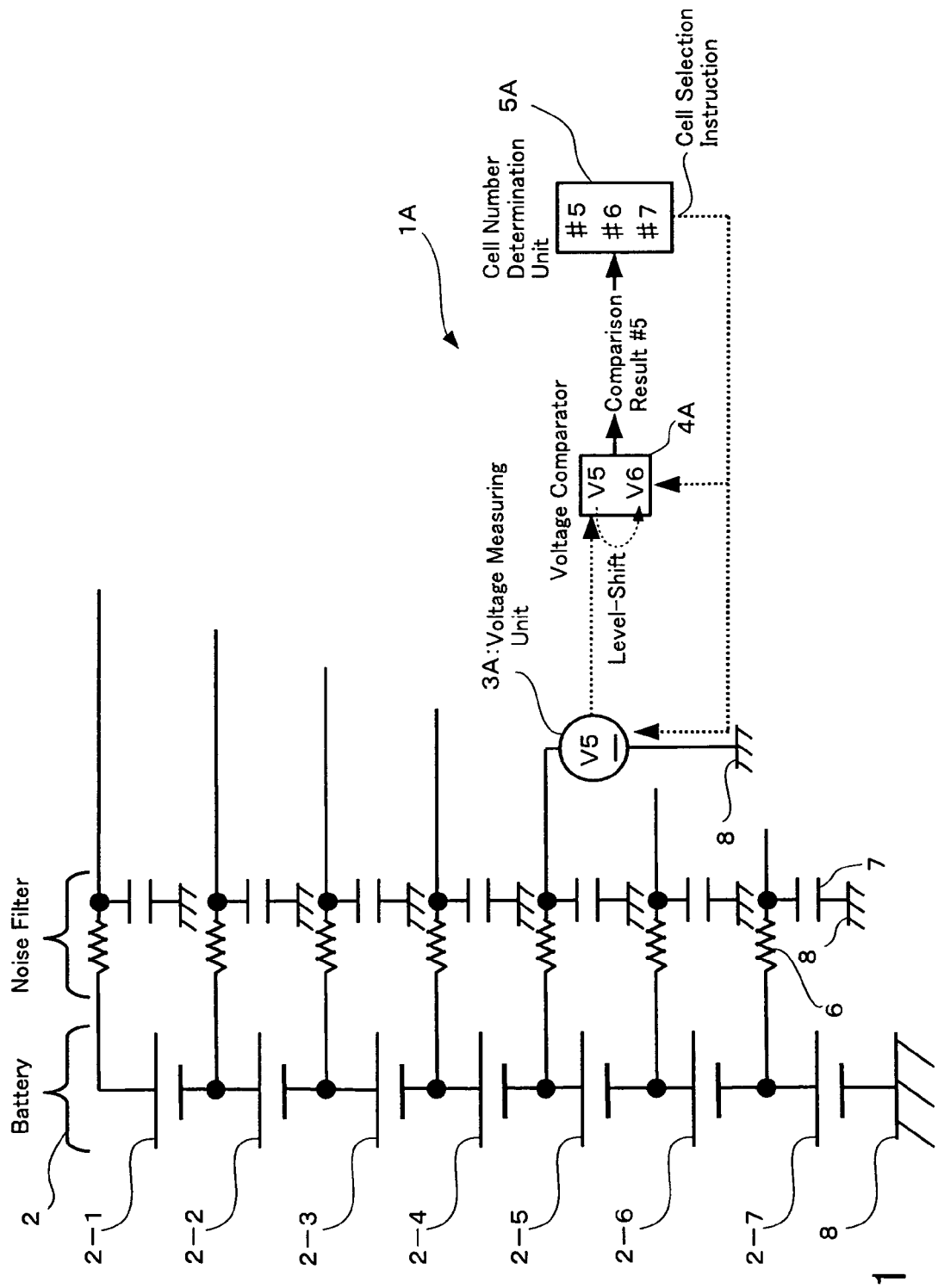
FIG. 11 is a schematic view having a block diagram and operation explaining diagram of a power supply device according to a second embodiment of the present invention.

Similarly, in the power supply device 1A of FIG. 11, the cell number determination unit 5A outputs the cell selection instruction to the voltage measuring unit 3A so that the voltage measuring unit 3A measures the voltage value V5 of the cell 2-5 in accordance with the cell selection instruction. In this case, the voltage value V6 (V) of the cell 2-6 that was previously measured and the voltage value V5 (V) as the measurement results of the cell 2-5 are stored in the voltage comparator 4A. The voltage comparator 4A compares the results obtained by subtracting the voltage value V6, which was stored at the last time and was performed by the level-shift, from the voltage value V5, which is stored at this time, with the predetermined threshold value and outputs the comparison result #5 to the cell number determination unit 5A.

As discussed above, the power supply device 1A performs the similar processing for the cell 2-4, the cell 2-3, and the cell 2-2.

Figure 12:
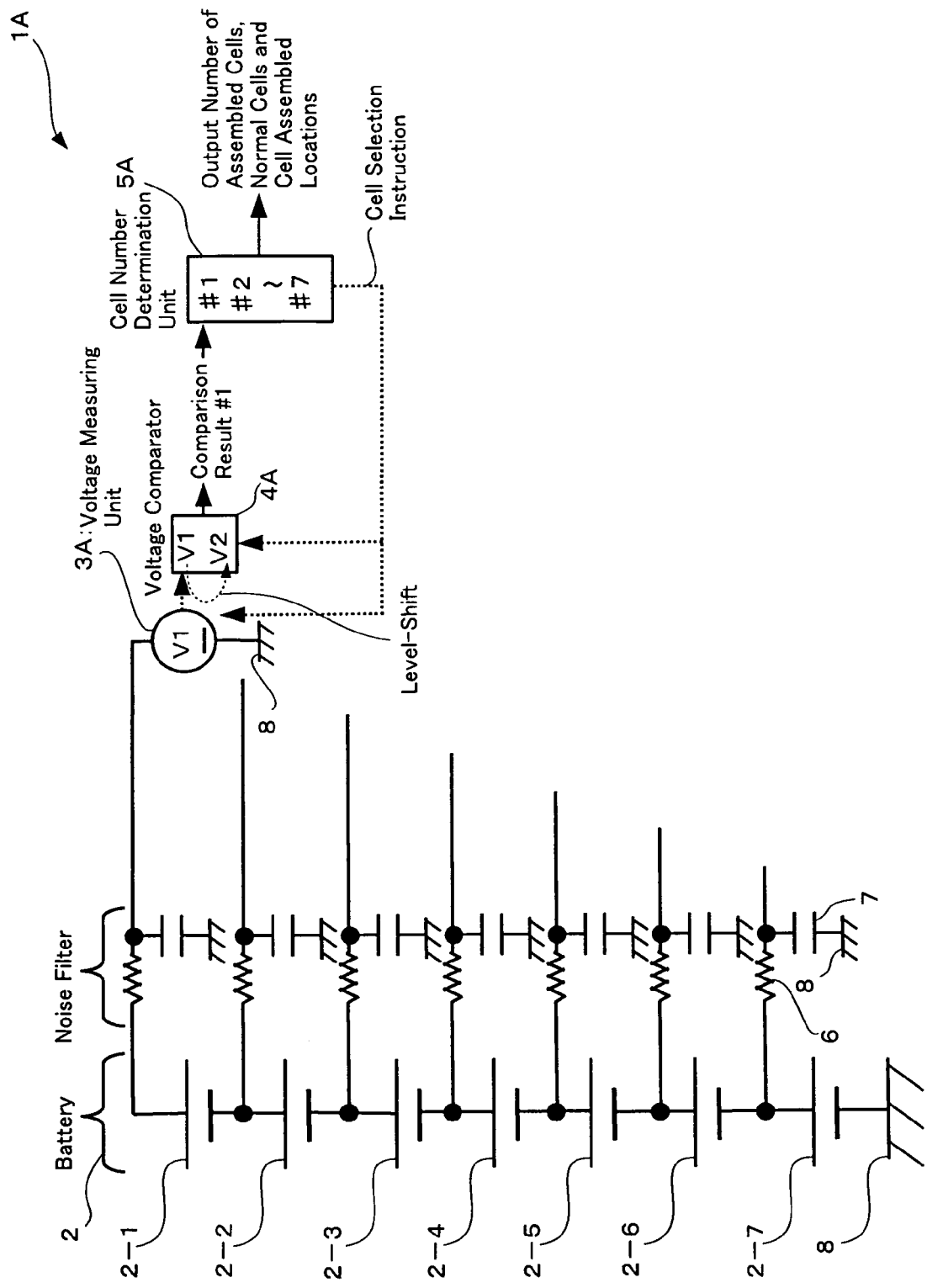
FIG. 12 is a schematic view having a block diagram and operation explaining diagram of a power supply device according to a second embodiment of the present invention.

In the power supply device 1A of FIG. 12, the cell number determination unit 5A outputs the cell selection instruction to the voltage measuring unit 3A so that the voltage measuring unit 3A measures the voltage value V1 of the cell 2-1 in accordance with the cell selection instruction. In this case, the voltage value V2 (V) of the cell 2-2 that was previously measured and the voltage value V1 (V) as the measurement results of the cell 2-1 are stored in the voltage comparator 4A. The voltage comparator 4A compares the results obtained by subtracting the voltage value V2, which was stored at the last time and was performed by the level-shift, from the voltage value V1, which is stored at this time, with the predetermined threshold value and outputs the comparison result #1 to the cell number determination unit 5A.

As a result, all the comparison results #1 to #7 are stored in the cell number determination unit 5. Subsequent determination processing is the same as explained in the first embodiment.

Figure 13:
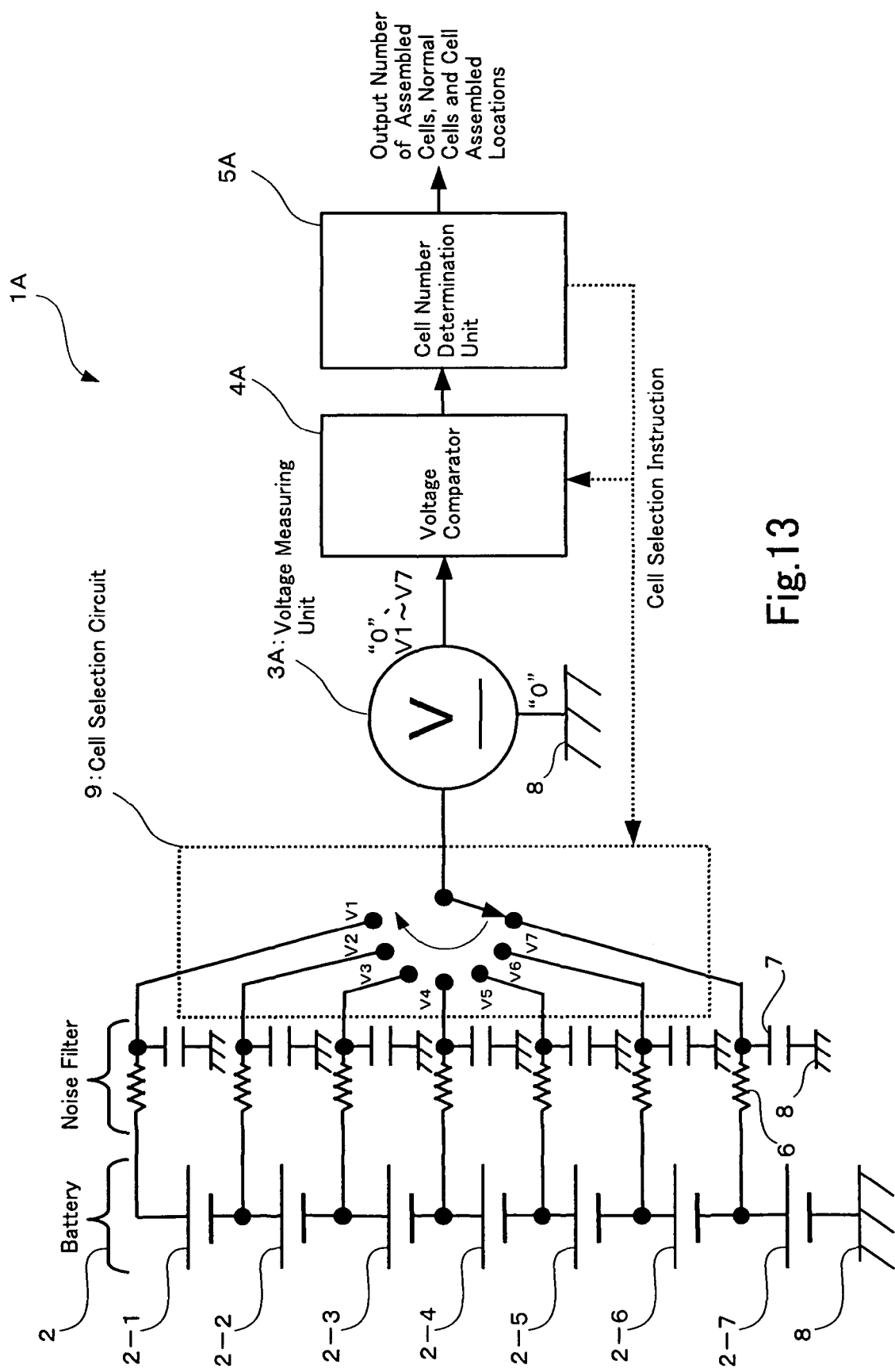
FIG. 13 is a schematic view for explaining a cell selection circuit of a power supply device according to a second embodiment of the present invention.

As explained in FIGS. 9-12, the same processing as the first embodiment is realized by using the single voltage measuring unit 3A and the single voltage comparator 4A. In this case, a cell selection circuit 9 shown in FIG. 13 is provided to connect between the voltage measuring unit 3A and arbitrary cells 2-1 to 2-7.

The cell selection circuit 9 connects between each terminal for the cells 2-1 to 2-7 and the voltage measuring unit 3A by switching. Selection operation of the cell selection circuit 9 is controlled by the cell number determination unit 5A. The voltage measuring unit 3A can connect to arbitrary cells 2-1 to 2-7 by providing the cell selection circuit 9. In FIG. 13, a selector switch with contact points are shown for the cell selection circuit 9 in an easily understood manner. However, in a practical sense, it is preferred that the cell selection circuit 9 is realized through a high speed selector switch without contact points by using a semiconductor element or an electronic component.

Figure 14:
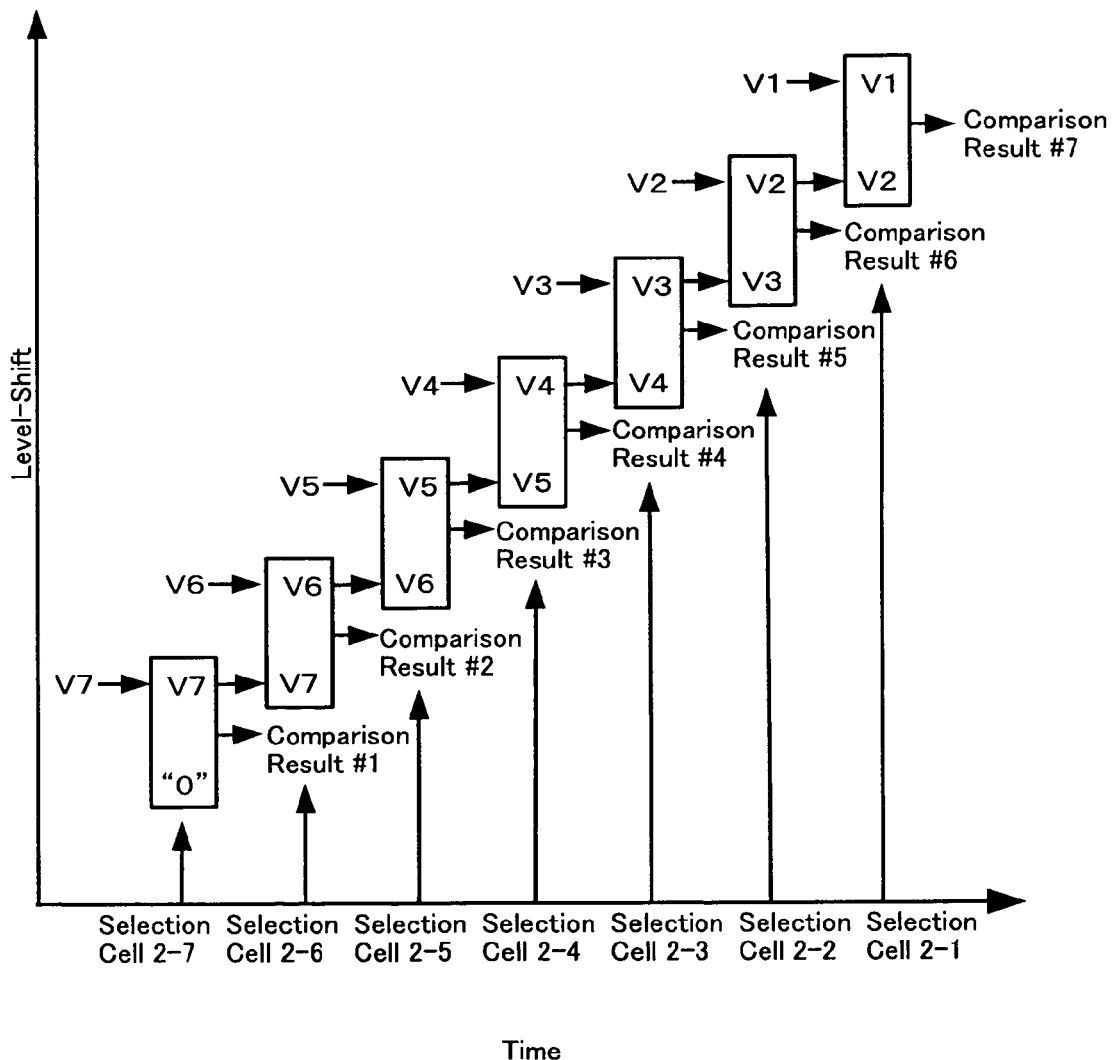
FIG. 14 is a schematic view showing condition for transition (level-shift) of a voltage value that is a target for comparison in a voltage comparator of a power supply device shown in FIG. 13.

Condition for transition (level-shift) of a voltage value that is a target for comparison in the voltage comparator 4A is shown in FIG. 14. In FIG. 14, the horizontal axis shows time, and the vertical axis shows condition of level-shift. As shown in FIG. 14, when the cell selection circuit 9 selects the cell 2-7, "0" (V) of the ground potential line 8 as a voltage value that is a target for comparison and the voltage value V7 that is measured at this time are stored in a memory (not shown) of the voltage comparator 4A. And, when the cell selection circuit 9 selects the cell 2-6, the voltage value V7 (V) of the cell 2-7, which was measured at the last time as a target voltage value for comparison and was performed by the level-shift and the voltage value V6 of the cell 2-6 that is measured at this time are stored in the memory (not shown) of the voltage comparator 4A. Similarly, when the cell selection circuit 9 selects the cell 2-5, the voltage value V6 (V) of the cell 2-6, which was measured at the last time as the target voltage value for comparison and was performed by the level-shift and the voltage value V5 of the cell 2-5 that is measured at this time are stored in the memory (not shown) of the voltage comparator 4A. Similarly, when the cell selection circuit 9 selects the cell 2-4, the voltage value V5 (V) of the cell 2-5, which was measured at the last time as the target voltage value for comparison and was performed by the level-shift and the voltage value V4 of the cell 2-4 that is measured at this time are stored in the memory (not shown) of the voltage comparator 4A. Similarly, when the cell selection circuit 9 selects the cell 2-3, the voltage value V4 (V) of the cell 2-4, which was measured at the last time as the target voltage value for comparison and was performed by the level-shift and the voltage value V3 of the cell 2-3 that is measured at this time are stored in the memory (not shown) of the voltage comparator 4A. Similarly, when the cell selection circuit 9 selects the cell 2-2, the voltage value V3 (V) of the cell 2-3, which was measured at the last time as the target voltage value for comparison and was performed by the level-shift and the voltage value V2 of the cell 2-2 that is measured at this time are stored in the memory (not shown) of the voltage comparator 4A. Similarly, when the cell selection circuit 9 selects the cell 2-1, the voltage value V2 (V) of the cell 2-2, which was measured at the last time as the target voltage value for comparison and was performed by the level-shift and the voltage value V1 of the cell 2-1 that is measured at this time are stored in the memory (not shown) of the voltage comparator 4A.

As discussed above, the single voltage comparator 4A can have functions that correspond to the seven voltage comparators 4-1 to 4-7 of the power supply device 1 shown in FIG. 1 through performing by level-shift with respect to the voltage value that is stored in the memory.

Configurations of the voltage measuring unit 3A and the voltage comparator 4A can be simplified by providing the cell selection circuit 9 compared with the power supply device 1 shown in FIG. 1.

Other Embodiments

The embodiments of the present invention can be modified in various ways so long as such variations are not to be regarded as a departure from the sprit and scope of the invention. For example, a single electronic circuit that has functions of the voltage measuring units 3-1 to 3-7 or 3A, the voltage comparators 4-1 to 4-7 or 4A, and the cell number determination unit 5 or 5A is configured so that such a single electronic circuit can be realized by an IC.

Alternatively, the voltage measuring units 3-1 to 3-7 or 3A, the voltage comparators 4-1 to 4-7 or 4A, and the cell number determination unit 5 or 5A may be configured with a general information processing device that is operated by a predetermined program (a central processing unit (CPU), a digital signal processor (DSP), and a microprocessor (microcomputer)). The general information processing device has, for example, a memory, a CPU, an input-output port, and so on. The CPU of the general information processing device executes by reading a control program as a predetermined program from the memory or the like. As a result, functions of the voltage measuring units 3-1 to 3-7 or 3A, the voltage comparators 4-1 to 4-7 or 4A, and the cell number determination unit 5 or 5A can be realize in the general information processing device.

Note that the control program that is executed by the general information processing device may be stored in a memory or the like of the general information processing device before shipment of the voltage measuring units 3-1 to 3-7 or 3A, the voltage comparators 4-1 to 4-7 or 4A, and the cell number determination unit 5 or 5A. Alternatively, the control program that is executed by the general information processing device may be stored in the memory or the like of the general information processing device after shipment of the voltage measuring units 3-1 to 3-7 or 3A, the voltage comparators 4-1 to 4-7 or 4A, and the cell number determination unit 5 or 5A. Part of the control program may be stored in the memory or the like of the general information processing device after shipment of the voltage measuring units 3-1 to 3-7 or 3A, the voltage comparators 4-1 to 4-7 or 4A, and the cell number determination unit 5 or 5A. The control program that is stored in the memory or the like of the general information processing device after shipment of the voltage measuring units 3-1 to 3-7 or 3A, the voltage comparators 4-1 to 4-7 or 4A, and the cell number determination unit 5 or 5A may be configured through, for example, installation of a program stored in a computer readable recording medium, such as a CD-ROM, or installation of a program downloaded via a transmission medium, such as the Internet.

The control program includes not only a program that is directly executable by the general information processing device, but also a program that is executable by installing it in a hard disk or the like. A compressed program and an encrypted program are also included.

When the voltage measuring units 3-1 to 3-7 or 3A, the voltage comparators 4-1 to 4-7 or 4A, and the cell number determination unit 5 or 5A are downsized by configuring with an IC or the general information processing device (CPU, DSP, microprocessor (microcomputer), and so on), it is possible to contain the unit inside of a battery pack in which the battery 2 is built-in.

As a result, the battery pack in which the voltage measuring units 3-1 to 3-7 or 3A, the voltage comparators 4-1 to 4-7 or 4A, and the cell number determination unit 5 or 5A are built-in can function as the power supply device 1, 1A that can determine the number of cells before control for a battery without providing a cell number setting means and input means.

Because S12, S16, and S18 in the flow diagram of FIG. 3 are provided to increase reliability of determination results, they may be omitted. In this case, omission of such processing can speed up the determination processing of FIG. 3.

It is explained that when power of the power supply device 1, 1A is turned on, the cell number determination processing is performed. However, when the cell number determination processing is periodically performed during operation of the power supply device 1, 1A, their results may be reflected to control or is displayed.

[Start-Up Sequence of Power Supply Device 1, 1A]

A start-up sequence of the power supply device 1, 1A is explained with reference to FIGS. 15 and 16A-16C. The start-up sequence of the power supply device 1A is explained below. However, its explanation is also common for the power supply device 1.

Figure 15:
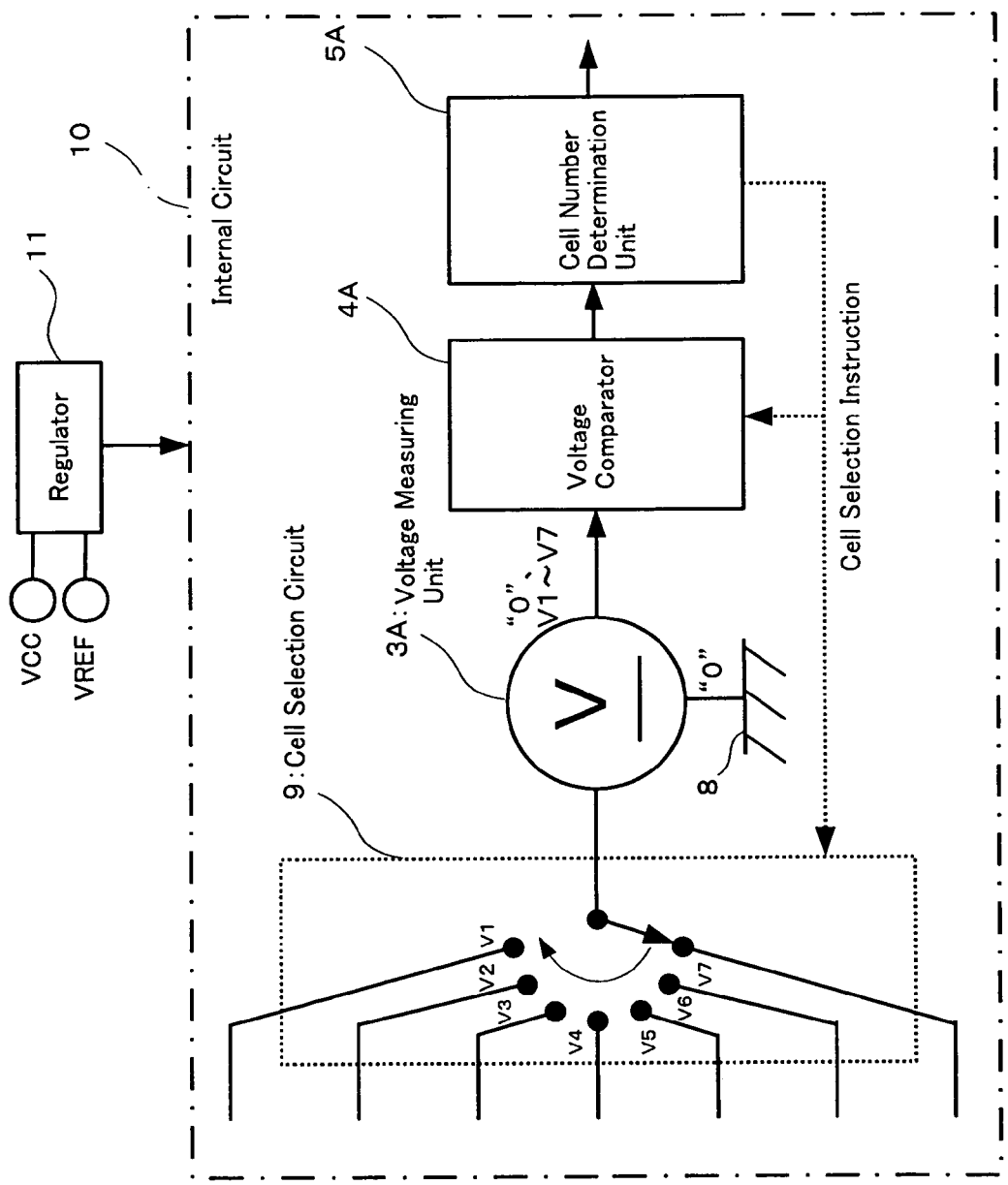
FIG. 15 is a schematic view of a case in which an internal circuit of a power supply device shown in FIG. 13 is realized by an IC.

When, for example, the battery 2, and the resistor 6 and the capacitor 7 as the noise filter are excluded from the power supply device 1A, an internal circuit 10 remains as shown in FIG. 15. When the internal circuit is realized by, for example, an IC, power is supplied to the internal circuit 10 by a regulator 11. The regulator has a VCC terminal (supply terminal) and VREF terminal (regulator output terminal).

Figure 16A:
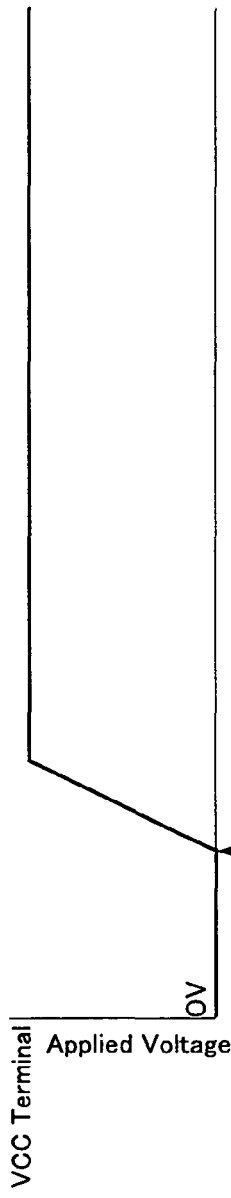
FIGS. 16A to 16C are schematic graphs explaining the start-up sequence of an internal circuit shown in FIG. 15.
Figure 16B:
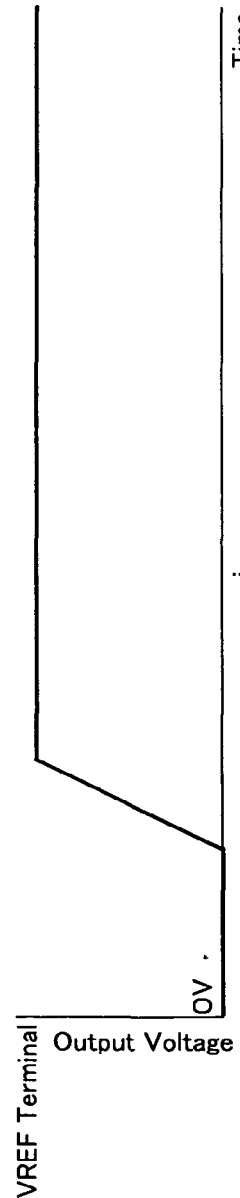
Figure 16C:
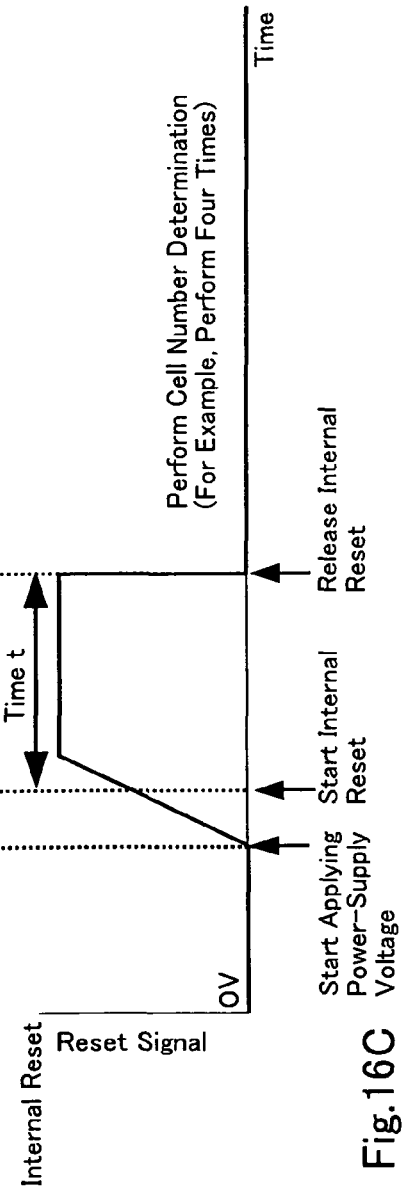

In an IC configuration shown in FIG. 15, when a power-supply voltage is applied to the VCC terminal as shown in FIG. 16A, an output voltage is obtained from the VREF terminal as shown in FIG. 16B. At this time, an internal reset of the cell selection circuit 9, the voltage comparator 4A, and the cell number determination unit 5A that configure the internal circuit 10 is performed as shown in FIG. 16C. As the internal reset, the cell selection circuit 9 is reset to an initial position of cell selection. As the internal reset, the voltage measuring unit 3A is reset to an initial value "0" (V). As the internal reset, the voltage comparator 4A is reset to clear the memory (erase). As the internal reset, the determination results in the memory (not shown) of the cell number determination unit 5A are cleared (erase). FIG. 16C shows timing of the internal reset with respect to a voltage value of a reset signal. According to this, time "t" is required from starting reset through releasing reset. The time "t" is, for example, 10 msec.

Therefore, it is preferred that timing for starting an operating procedure of the flow diagram shown in FIGS. 2 and 3 is started right after the reset for the internal circuit 10 is released. Because various parameters for determining the number of cells are stable, highly accurate determination results are obtained.

For example, in the case in which the power supply device 1, 1A is a battery pack, after equipment is connected to the battery pack, and after power of the equipment is turned on, the battery pack starts to operate. In this case, the power-supply voltage is also applied to the regulator 11. Therefore, it is preferred that the cell number determination processing starts after time (t+α) that is from starting operation of the battery pack (power-supply voltage application start) until releasing the internal reset by the internal circuit 10. The time (t+α) is, for example, 12 msec.

The method for determining a cell number, the cell number determination device, the power supply device, and the program being thus described, it will be apparent that the same may be varied in many ways. Such variations are not to be regarded as a departure from the sprit and scope of the invention, and all such modifications as would be apparent to one of ordinary skill in the art are intended to be included within the scope of the following claims.

What is claimed is:

1. A cell number determination device comprising:
a voltage measuring unit that selects an $i^{th}$ cell, where i is an integer from 1 to N, among a number N of cells that are connected in series and that configures a battery, and that measures a voltage value between a terminal in which the $i^{th}$ cell and $(i-1)^{th}$ cell, which is in one location higher than the $i^{th}$ cell, are connected and a ground potential line;
a voltage comparator that determines whether the $i^{th}$ cell exists normally or not by comparing a voltage value of an $(i+1)^{th}$ cell that is in one location lower than the $i^{th}$ cell with the voltage value of the $i^{th}$ cell measured by the voltage measuring unit; and
a cell number determination unit that determines a number of assembled cells and normal cells and cell assembled locations in the overall battery based on a comparison result of the voltage comparator,
wherein
the cell number determination unit determines whether or not the cells that the voltage comparator determined to be existing normally are continuous, and
when at least one of the N cells is determined not to exist normally, and the cell number determination unit determines that the number of cells that are existing normally are continuous, the cell number determination unit determines number of assembled cells to be the number of continuous cells that are existing normally.

2. The cell number determination device according to claim 1, wherein
when the cell in which one terminal is connected to the ground potential line is a bottom-level $N^{th}$ cell, the cell number determination unit instructs the voltage measuring unit to measure a voltage between a terminal in which the $N^{th}$ cell and the $(N-1)^{th}$ cell that is in one location higher than the $N^{th}$ cell are connected and the ground potential line,
when a voltage difference between a measurement result by the voltage measuring unit and the ground potential line is equal to or less than a predetermined threshold value, or is less than the predetermined threshold value, the cell number determination unit instructs the voltage comparator to determine that the $N^{th}$ cell is not assembled or has failed to operate properly even though the $N^{th}$ cell is assembled,
the cell number determination unit instructs the voltage measuring unit to measure a voltage between a terminal in which the $(N-1)^{th}$ cell and an $(N-2)^{th}$ cell that is in one location higher than the $(N-1)^{th}$ cell are connected and the ground potential line,
when a voltage difference between a measurement result by the voltage measuring unit and the measurement result of the voltage value of the $N^{th}$ cell is equal to or less than a predetermined threshold value, or is less than the predetermined threshold value, the cell number determination unit instructs the voltage comparator to determine that the $(N-1)^{th}$ cell is not assembled or has failed to operate properly even though the $(N-1)^{th}$ cell is assembled, and
the total number of assembled cells, the number of normally existing cells, and the cell assembled locations of the normally existing cells in the overall battery are determined based on a result that is obtained by repeatedly executing the processing by the voltage measuring unit and the voltage comparator, until an upper-level first cell is reached.

3. The cell number determination device according to claim 2, wherein
the voltage measuring unit is a single voltage measuring unit and the voltage comparator is a single voltage comparator,
a selector switch that connects the N number of the terminals that are target for measurement for N number of the cells and the single voltage measuring unit through sequentially switching is provided, and
the single voltage comparator stores and compares a previous measurement result with a latest measurement result among measurement results of the cells that are sequentially output from the voltage measuring unit in accordance with switching the selector switch.

4. A power supply device comprising:
the cell number determination device according to claim 1; and
a battery with a plurality of cells, wherein
the cell number determination unit determines the number of assembled cells and normal cells and cell assembled locations in the battery as power-on is a trigger.

5. The power supply device according to claim 4, wherein
when all determination results in which determinations are performed several times are the same, the cell number determination unit determines that the determination result is correct.

6. A power supply device comprising:
the cell number determination device according to claim 2; and
a battery with a plurality of cells, wherein
the cell number determination unit determines the number of assembled cells and normal cells and cell assembled locations in the battery as power-on is a trigger.

7. The power supply device according to claim 6, wherein
when all determination results in which determinations are performed several times are the same, the cell number determination unit determines that the determination result is correct.

8. A power supply device comprising:
the cell number determination device according to claim 3; and
a battery with a plurality of cells, wherein
the cell number determination unit determines a number of assembled cells and normal cells and cell assembled locations in the battery as power-on is a trigger.

9. The power supply device according to claim 8, wherein when all determination results in which determinations are performed several times are the same, the cell number determination unit determines that the determination result is correct.

10. The cell number determination device according to claim 1, wherein
the voltage comparator also determines normality or abnormality of the cells by comparing the voltage value of the $(i+1)^{th}$ cell that is in one location lower than the $i^{th}$ cell with the voltage value of the $i^{th}$ cell measured by the voltage measuring unit.

11. The cell number determination device according to claim 1, wherein
the N cells are each single-cell lithium cells.

12. A method for determining a cell number that is executed by a cell number determination device for determining a number of assembled cells and normal cells, and cell assembled locations in a battery configured with a plurality of cells, comprising:
executing a voltage measuring step that selects an $i^{th}$ cell, where i is an integer from 1 to N, among a number N of cells that are connected in series and that configure the battery, and that measures a voltage value between a terminal in which the $i^{th}$ cell and an $(i-1)^{th}$ cell that is in one location higher than the $i^{th}$ cell are connected and a ground potential line;
executing a voltage comparison step that determines whether the $i^{th}$ cell exists normally or not by comparing a voltage value of an $(i+1)^{th}$ cell that is in one location lower than the $i^{th}$ cell with the voltage value of the $i^{th}$ cell measured by the voltage measuring unit; and
executing a cell number determination step that determines a total number of assembled cells, a number of normally existing cells, and cell assembled locations of the normally existing cells in the overall battery based on a comparison result of a voltage comparator through a cell number determination unit of the cell number determination device,
wherein
the voltage comparison step determines whether or not the cells that the voltage comparator determined to be existing normally are continuous, and
when at least one of the N cells is determined not to exist normally, and the cell number determination step determines that the number of cells that are existing normally are continuous, the cell number determination step determines number of assembled cells to be the number of continuous cells that are existing normally.

13. The method for determining a cell number according to claim 12, wherein
as processing of a cell number determination step executed by the cell number determination unit,
when the cell in which one terminal is connected to the ground potential line is a bottom-level $N^{th}$ cell, the cell number determination unit executes the voltage measuring step to measure a voltage between a terminal in which the $N^{th}$ cell and the $(N-1)^{th}$ cell that is in one location higher than the $N^{th}$ cell are connected and the ground potential line,
when a voltage difference between a measurement result by the voltage measuring step and the ground potential line is equal to or less than a predetermined threshold value, or is less than the predetermined threshold value, the cell number determination unit executes the voltage comparator step to determine that the $N^{th}$ cell is not assembled or has failed to operate properly even though the $N^{th}$ cell is assembled,
the cell number determination unit executes the voltage measuring step to measure a voltage between a terminal in which the $(N-1)^{th}$ cell and an $(N-2)^{th}$ cell that is in one location higher than the $(N-1)^{th}$ cell are connected and the ground potential line,
when a voltage difference between a measurement result by the voltage measuring step and the measurement result of the voltage value of the $N^{th}$ cell is equal to or less than a predetermined threshold value, or is less than the predetermined threshold value, the cell number determination unit executes the voltage comparator step to determine that the $(N-1)^{th}$ cell is not assembled or has failed to operate properly even though the $(N-1)^{th}$ cell is assembled, and
the total number of assembled cells, the number of normally existing cells, and the cell assembled locations of the normally existing cells in the overall battery are determined based on a result that is obtained by repeatedly executing the processing by the voltage measuring step and the voltage comparator step, until an upper-level first cell is reached.

14. The method for determining a cell number according to claim 12, further comprising:
determining normality or abnormality of the cells by comparing the voltage value of the $(i+1)^{th}$ cell that is in one location lower than the $i^{th}$ cell with the voltage value of the $i^{th}$ cell measured by the voltage measuring unit.

15. A computer program embodied in a non-transitory computer-readable medium in an information processing device, comprising:
a first program element configured to instruct a voltage measuring unit to select an $i^{th}$ cell, where i is an integer from 1 to N, among a number N of cells that are connected in series and that configure a battery, and to measure a voltage value between a terminal in which the $i^{th}$ cell and an $(i-1)^{th}$ cell, which is in one location higher than the $i^{th}$ cell, are connected and a ground potential line;
a second program element configured to instruct a voltage comparator to determine whether the $i^{th}$ cell exists normally or not by comparing a voltage value of an $(i+1)^{th}$ cell that is in one location lower than the $i^{th}$ cell with the voltage value of the $i^{th}$ cell measured by the voltage measuring unit; and
a third program element configured to instruct a cell number determination unit to determine a total number of assembled cells, a number of normally existing cells, and cell assembled locations of the normally existing cells in the overall battery based on a comparison result of the voltage comparator,
wherein
the cell number determination unit determines whether or not the cells that the voltage comparator determined to be existing normally are continuous, and
when at least one of the N cells is determined not to exist normally, and the cell number determination unit determines that the number of cells that are existing normally are continuous, the cell number determination unit determines number of assembled cells to be the number of continuous cells that are existing normally.

16. The computer program according to claim 15, wherein when the cell in which one terminal is connected to the ground potential line is a bottom-level $N^{th}$ cell, the first program element is configured to instruct the voltage measuring unit to measure a voltage between a terminal in which the $N^{th}$ cell and the $(N-1)^{th}$ cell that is in one location higher than the $N^{th}$ cell are connected and the ground potential line, when a voltage difference between a measurement result by the voltage measuring unit and the ground potential line is equal to or less than a predetermined threshold value, or is less than the predetermined threshold value, the second program element is configured to instruct the voltage comparator to determine that the $N^{th}$ cell is not assembled or has failed to operate properly even though the $N^{th}$ cell is assembled, the first program element is configured to instruct the voltage measuring unit to measure a voltage between a terminal in which the $(N-1)^{th}$ cell and an $(N-2)^{th}$ cell that is in one location higher than the $(N-1)^{th}$ cell are connected and the ground potential line, when a voltage difference between a measurement result by the voltage measuring unit and the measurement result of the voltage value of the $N^{th}$ cell is equal to or less than a predetermined threshold value, or is less than the predetermined threshold value, the second program element is configured to instruct the voltage comparator to determine that the $(N-1)^{th}$ cell is not assembled or has failed to operate properly even though the $(N-1)^{th}$ cell is assembled, and the program is configured to determine the total number of assembled cells, the number of normally existing cells, and the cell assembled locations of the normally existing cells in the overall battery based on a result that is obtained by repeatedly executing the first, second, and third program elements to control the voltage measuring unit and the voltage comparator, until an upper-level first cell is reached.

17. The computer program according to claim 16, wherein the single voltage measuring unit and the single voltage comparator are provided, a selector switch that connects the N number of the terminals that are target for measurement for N number of the cells and the single voltage measuring unit through sequentially switching is provided, and the single voltage comparator stores and compares a previous measurement result with a latest measurement result among measurement results of the cells that are sequentially output from the voltage measuring unit in accordance with switching the selector switch.

18. The computer program according to claim 15, wherein first program element is further configured to instruct the voltage comparator to determine normality or abnormality of the cells by comparing the voltage value of the $(i+1)^{th}$ cell that is in one location lower than the $i^{th}$ cell with the voltage value of the $i^{th}$ cell measured by the voltage measuring unit.

* * * * *